(12) United States Patent
Nakazawa et al.

(10) Patent No.: US 10,971,695 B2
(45) Date of Patent: Apr. 6, 2021

(54) MULTILAYER REFLECTION ELECTRODE FILM, MULTILAYER REFLECTION ELECTRODE PATTERN, AND METHOD OF FORMING MULTILAYER REFLECTION ELECTRODE PATTERN

(71) Applicant: MITSUBISHI MATERIALS CORPORATION, Tokyo (JP)

(72) Inventors: Hiromi Nakazawa, Naka (JP); Hiroshi Ishii, Naka (JP); Yuto Toshimori, Naka (JP); Atsushi Saito, Sanda (JP); Yujiro Hayashi, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/086,623

(22) PCT Filed: Mar. 22, 2017

(86) PCT No.: PCT/JP2017/011347
§ 371 (c)(1),
(2) Date: Sep. 20, 2018

(87) PCT Pub. No.: WO2017/164211
PCT Pub. Date: Sep. 28, 2017

(65) Prior Publication Data
US 2019/0103580 A1    Apr. 4, 2019

(30) Foreign Application Priority Data

Mar. 23, 2016  (JP) .............................. JP2016-059097
Feb. 13, 2017  (JP) .............................. JP2017-024269

(51) Int. Cl.
*H01L 51/30*    (2006.01)
*H01L 51/52*    (2006.01)
(Continued)

(52) U.S. Cl.
CPC .......... *H01L 51/5218* (2013.01); *H01B 1/02* (2013.01); *H01L 51/50* (2013.01); *H05B 33/10* (2013.01);
(Continued)

(58) Field of Classification Search
None
See application file for complete search history.

(56) References Cited

U.S. PATENT DOCUMENTS

2010/0065424 A1* 3/2010 Takahashi ............. C04B 35/638
  204/298.13
2010/0258833 A1   10/2010 Okumoto et al.
(Continued)

FOREIGN PATENT DOCUMENTS

CN    102104093 A    6/2011
CN    102337505 A    2/2012
(Continued)

OTHER PUBLICATIONS

Chang et al, Ga-doped TiZnO transparent conductive oxide used as an alternative anode in blue, green, and red phosphorescent OLEDs, 2014, Phys. Chem., p. 19618-19624. (Year: 2014).*
(Continued)

*Primary Examiner* — Fernando L Toledo
*Assistant Examiner* — Valerie N Newton
(74) *Attorney, Agent, or Firm* — Locke Lord LLP

(57) ABSTRACT

A multilayer reflection electrode film includes a Ag film that is formed of Ag or an Ag alloy; and a transparent conductive oxide film that is disposed on the Ag film, in which the transparent conductive oxide film is formed of an oxide that includes Zn and Ga and further includes one element or two or more elements selected from the group consisting of Sn, Y, and Ti.

12 Claims, 6 Drawing Sheets

(51) Int. Cl.
*H01L 51/50* (2006.01)
*H01B 1/02* (2006.01)
*H05B 33/10* (2006.01)
*H05B 33/26* (2006.01)

(52) U.S. Cl.
CPC ........ *H05B 33/26* (2013.01); *H01L 2251/303* (2013.01)

(56) References Cited

U.S. PATENT DOCUMENTS

| | | | |
|---|---|---|---|
| 2011/0001153 | A1 | 1/2011 | Tchakarov et al. |
| 2011/0006302 | A1* | 1/2011 | Yamazaki ......... H01L 21/02565 257/43 |
| 2011/0147771 | A1* | 6/2011 | Moon ................ H01L 21/0242 257/94 |
| 2012/0326189 | A1* | 12/2012 | Lee .................... H01L 51/5218 257/98 |
| 2015/0228850 | A1* | 8/2015 | Zheng ................. H01L 51/502 257/13 |
| 2016/0118625 | A1 | 4/2016 | Uesaka et al. |
| 2017/0271151 | A1* | 9/2017 | Yaguchi .................... G03F 7/40 |

FOREIGN PATENT DOCUMENTS

| | | |
|---|---|---|
| JP | H10-040740 A | 2/1998 |
| JP | 2000-133466 A | 5/2000 |
| JP | 2002-363732 A | 12/2002 |
| JP | 2004-103247 A | 4/2004 |
| JP | 2004-156070 A | 6/2004 |
| JP | 2006-098856 A | 4/2006 |
| JP | 2006-294261 A | 10/2006 |
| JP | 2009-298649 A | 12/2009 |
| JP | 2011-009790 A | 1/2011 |
| JP | 2012-246511 A | 12/2012 |
| JP | 2013-105546 A | 5/2013 |
| JP | 2015-178239 A | 10/2015 |
| JP | 2016-085970 A | 5/2016 |
| KR | 10-2012-0123185 A | 11/2012 |
| WO | 2010/032443 A1 | 3/2010 |
| WO | 2016/024615 A1 | 2/2016 |

OTHER PUBLICATIONS

"Technology of Transparent Conductive Films (Second Revised Edition)", Japanese Society for the Promotion of Science the 166th Committee on Photonic and Electronic Oxide, Ohmsha Ltd., Second Edition First Printing, Dec. 20, 2006, p. 171-172, cover page, information sheet and partial English translation thereof. (discussed in the spec).

International Search Report dated Jun. 13, 2017, issued for PCT/JP2017/011347 and English translation thereof.

Office Action dated Aug. 7, 2019, issued for Chinese Patent Application No. 201780018466.6 and English translation thereof.

Supplementary European Search Report dated Nov. 6, 2019, issued for the European patent application No. 17770251.1.

Office Action dated Jul. 13, 2020, issued for Chinese Patent Application No. 201780018466.6 and English translation thereof.

Office Action dated Aug. 31, 2020, issued for Taiwanese patent application No. 106109573 and English translation thereof.

* cited by examiner

MULTILAYER REFLECTION ELECTRODE FILM, MULTILAYER REFLECTION ELECTRODE PATTERN, AND METHOD OF FORMING MULTILAYER REFLECTION ELECTRODE PATTERN

TECHNICAL FIELD

The present disclosure relates to a multilayer reflection electrode film that can be used as, for example, an anode of an organic electroluminescence (EL) element, a multilayer reflection electrode pattern formed of the multilayer reflection electrode film, and a method of forming the multilayer reflection electrode pattern.

Priority is claimed on Japanese Patent Application No. 2016-059097, filed Mar. 23, 2016 and Japanese Patent Application No. 2017-024269, filed Feb. 13, 2017, the contents of which are incorporated herein by reference.

BACKGROUND ART

In general, an organic EL display is formed of organic EL elements arranged on a transparent substrate. An organic EL element includes an anode, an organic EL light emitting layer, and a cathode that are formed on a transparent substrate in a predetermined pattern and is a light emitting element that uses a principle in which light is emitted when holes and electrons are injected into the organic EL layer from the anode and the cathode, respectively, and are combined with each other in the organic EL light emitting layer.

As a light extraction type of the organic EL element, a bottom emission type of extracting light from the transparent substrate side and a top emission type of extracting light from a side opposite to the transparent substrate are known. Here, the top emission type has a higher aperture ratio than the bottom emission type, and thus is advantageous in increasing luminance. The anode used in the top emission type organic EL element is desired to have a reflectance that is high in order to efficiently extract light generated from the electroluminescence layer to the outside; a high conductivity; and a work function that is sufficiently high such that holes can be efficiently injected into the electroluminescence layer.

For example, in Patent Documents 1 and 2, a multilayer film in which a work function is increased by performing an oxygen plasma treatment or the like on a surface of a metal film to form a surface oxide film is used as an anode of an organic EL element.

Further, in Patent Documents 3, 4, and 5, a multilayer film in which a transparent conductive film such as an ITO film is formed on a surface of a metal film is used as an electrode of an organic EL element. Further, in Patent Document 6, a surface-modified ITO film in which a work function is increased by irradiating a surface of an ITO film with oxygen ions or electrons to modify the surface is used as an anode of an organic EL element.

Patent Document 7 describes that zinc oxide (ZnO), aluminum-doped zinc oxide (AZO), or gallium-doped zinc oxide (GZO) is used as a metal oxide in a multilayer film in which a metal oxide thin film is laminated on a conductive layer including Ag as a major component.

However, as described in NPL 1, a metal oxide including ZnO is likely to be dissolved in a resist remover (weak alkali) used in an etching method. Therefore, it is difficult to form a fine electrode pattern in which a multilayer film using a metal oxide including ZnO such as AZO or GZO is used as an electrode for an organic EL display through an etching method.

CITATION LIST

Patent Document

[Patent Document 1] Japanese Unexamined Patent Application, First Publication No. 2006-294261
[Patent Document 2] PCT International Publication No. WO2010/032443 [Patent Document 3] Japanese Unexamined Patent Application, First Publication No. 2006-98856
[Patent Document 4] Japanese Unexamined Patent Application, First Publication No. 2011-9790
[Patent Document 5] Japanese Unexamined Patent Application, First Publication No. 2004-103247
[Patent Document 6] Japanese Unexamined Patent Application, First Publication No. 2000-133466
[Patent Document 7] Japanese Unexamined Patent Application, First Publication No. 2012-246511

Non-Patent Literature

[Non-Patent Document 1] "Technology of Transparent Conductive Films (Second Revised Edition)", p. 171-172, JAPANESE SOCIETY FOR THE PROMOTION OF SCIENCE The 166th Committee on Photonic and Electronic Oxide, Ohmsha Ltd., Second Edition First Printing, Dec. 20, 2006

DISCLOSURE OF INVENTION

Technical Problem

Recently, a reduction in size and an increase in luminance for an organic EL element or the like have been progressed, and the multilayer reflection electrode film is required to have low electrical resistance and high reflectance equivalent to those of pure silver. In addition, during the manufacturing of an organic EL element, it is required to enable the easy formation of a fine electrode pattern formed of a multilayer reflection electrode film using an etching method.

However, in the multilayer film including the surface oxide film described in Patent Documents 1 and 2, the reflectance may decrease and the resistivity may increase due to damage by the oxygen plasma treatment. In addition, in a case where a Ag film formed of pure silver is used as a metal film, sulfur resistance is insufficient, and thus the reflectance may decrease and the resistivity may increase during use in the atmosphere.

On the other hand, in the multilayer film described in Patent Documents 3, 4, and 5 in which the transparent conductive film such as ITO is formed, the reflectance of visible light, in particular, the reflectance of light in a blue wavelength range (400 to 500 nm) may decrease. In particular, in a case where the surface of the ITO film is irradiated with oxygen ions or electrons to modify the surface as described in Patent Document 6, the surface of the ITO film is roughened such that light may be scattered. In addition, in a case where an electrode pattern is formed by etching on a multilayer film including an Ag alloy film and an ITO film, the etching rate of the Ag alloy film is higher than that of the ITO film. Therefore, in a case where the Ag alloy film and the ITO film are collectively etched using the same etchant, the Ag alloy film may be over-etched, or ITO film residues may remain.

The present disclosure has been made in consideration of the above-described circumstances, and an object thereof is to provide: a multilayer reflection electrode film having a high reflectance in a visible range, in particular, in a blue wavelength range and having a low resistance value with which a fine electrode pattern can be easily formed using an etching method; a multilayer reflection electrode pattern formed of the multilayer reflection electrode film; and a method of forming the multilayer reflection electrode pattern.

Solution to Problem

According to the present disclosure for solving the above-described problems, a multilayer reflection electrode film is provided including: a Ag film that is formed of Ag or an Ag alloy; and a transparent conductive oxide film that is disposed on the Ag film, in which the transparent conductive oxide film is formed of an oxide that includes Zn and Ga and further includes one element or two or more elements selected from the group consisting of Sn, Y, and Ti.

The multilayer reflection electrode film according to the present disclosure includes the Ag film, and thus has low electrical resistance. The transparent conductive oxide film formed of the oxide that includes Zn and Ga and further includes one element or two or more elements selected from the group consisting of Sn, Y, and Ti is disposed on the Ag film. Therefore, the reflectance in a visible light, in particular, in a blue wavelength range is high. The reason for this is presumed to be that a refractive index of the transparent conductive oxide film in the visible range, in particular, in the blue wavelength range, is lower than that of other transparent conductive oxides such as ITO. In addition, the transparent conductive oxide film further includes one element or two or more elements selected from the group consisting of Sn, Y, and Ti. Therefore, alkali resistance is improved, and the transparent conductive oxide film is not likely to be dissolved in an alkaline resist remover. Therefore, with the multilayer reflection electrode film according to the present disclosure, an electrode pattern can be formed using an etching method.

Further, during formation of an electrode pattern using an etching method, in a case where the Ag film and the transparent conductive oxide film are etched by using an acidic mixed solution including phosphoric acid and acetic acid as an etchant, the difference in etching rate is small. Accordingly, in a case where an electrode pattern is formed using an etching method with the multilayer reflection electrode film according to the present disclosure, the amount of over-etching is small.

The transparent conductive oxide film has a higher work function than ITO and thus can also be used without modifying the surface by irradiation of oxygen ions or electrons.

In the multilayer reflection electrode film according to the present disclosure, it is preferable that atomic proportions with respect to all the metal elements included in the transparent conductive oxide film are Ga: 0.5 at % to 30.0 at %, each of Sn, Y, and Ti: 0.1 at % to 10.0 at %, and a balance of Zn.

In this case, the Ga content with respect to all the metal elements included in the transparent conductive oxide film is in a range of 0.5 at % to 30.0 at %. Therefore, adhesiveness between the Ag film and the transparent conductive oxide film can be improved while preventing an increase in electrical resistance. In addition, each of the contents of Sn, Y, and Ti is in a range of 0.1 at % to 10.0 at %. Therefore, alkali resistance and environment resistance can be improved while preventing an increase in electrical resistance. Further, in order to further improve the effect of improving alkali resistance, it is more preferable that the transparent conductive oxide film 13 further includes Y.

In addition, in the multilayer reflection electrode film according to the present disclosure, it is more preferable that atomic proportions with respect to all the metal elements included in the transparent conductive oxide film are Ga: 0.5 at % to 18.0 at %, each of Sn, Y, and Ti: 0.1 at % to 10.0 at %, and a balance of Zn.

In this case, the Ga content with respect to all the metal elements included in the transparent conductive oxide film is in a range of 0.5 at % to 18.0 at %. Therefore, adhesiveness between the Ag film and the transparent conductive oxide film can be further improved while further preventing an increase in electrical resistance. In addition, each of the contents of Sn, Y, and Ti is in a range of 0.1 at % to 10.0 at %. Therefore, alkali resistance and environment resistance can be improved while preventing an increase in electrical resistance.

Further, in the multilayer reflection electrode film the present disclosure, it is more preferable that atomic proportions with respect to all the metal elements included in the transparent conductive oxide film are Ga: 0.5 at % to 14.0 at %, each of Sn, Y, and Ti: 0.1 at % to 10.0 at %, and a balance of Zn.

In this case, the Ga content with respect to all the metal elements included in the transparent conductive oxide film is in a range of 0.5 at % to 14.0 at %. Therefore, adhesiveness between the Ag film and the transparent conductive oxide film can be further improved while further preventing an increase in electrical resistance. In addition, each of the contents of Sn, Y, and Ti is in a range of 0.1 at % to 10.0 at %.

Therefore, alkali resistance and environment resistance can be improved while preventing an increase in electrical resistance.

In the multilayer reflection electrode film according to the present disclosure, it is preferable that the Ag film is formed of an Ag alloy including 0.2 at % to 2.0 at % of one element or two or more elements in total selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er and a balance of Ag and inevitable impurities.

In this case, the Ag film includes one element or two or more elements in total selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er and a balance of Ag and inevitable impurities. Therefore, sulfur resistance, heat resistance, or the like of the Ag film can be improved, and deterioration can be prevented. As a result, the Ag film can be stably used for a long period of time.

Further, in the multilayer reflection electrode film according to the present disclosure, it is preferable that a thickness of the Ag film is 50 nm or more, and it is preferable that a thickness of the transparent conductive oxide film is 100 nm or less.

In this case, the thickness of the Ag film is 50 nm or more. Therefore, the amount of visible light reflected from the surface of the Ag film increases, and the reflectance of visible light is improved. In addition, the thickness of the transparent conductive oxide film is 100 nm or less. Therefore, the transmittance of visible light in the transparent conductive oxide film is improved, and the amount of visible light reflected from the surface of the Ag film increases According to the present disclosure, a multilayer reflection electrode pattern is provided that is formed of the above-described multilayer reflection electrode film, the multilayer reflection electrode pattern including a predetermined pattern.

The multilayer reflection electrode pattern according to the present disclosure is formed of the above-described multilayer reflection electrode film. Therefore, the electrical resistance is low, and the reflectance of visible light, in particular, light in a blue wavelength range is high.

According to the present disclosure, there is provided a method of forming the multilayer reflection electrode pattern, the method including: a multilayer reflection electrode film forming step of forming the multilayer reflection electrode film including the Ag film and the transparent conductive oxide film on a film forming surface of a base material; a resist film forming step of forming a resist film having a predetermined pattern shape on the multilayer reflection electrode film; an etching step of collectively etching the multilayer reflection electrode film on which the resist film is formed by using an acidic mixed solution including phosphoric acid and acetic acid as an etchant; and a resist film removing step of removing the resist film after etching.

In the method of forming the multilayer reflection electrode pattern having the above-described configuration, in a case where the acidic mixed solution including phosphoric acid and acetic acid is used as an etchant, a difference in etching rate between the Ag film and the transparent conductive oxide film is small. Therefore, even in a case where the multilayer reflection electrode film is collectively etched, the over-etching of the Ag film or the remaining of residues of the transparent conductive oxide film can be prevented, and the electrode pattern can be accurately formed. In addition, alkali resistance of the transparent conductive oxide film is improved due to the addition of one or two or more elements selected from the group consisting of Sn, Y, and Ti. Therefore, even in a case where the resist film is removed using the alkaline resist remover in the resist film removing step, deterioration of the characteristics of the multilayer reflection electrode pattern can be prevented.

According to the present disclosure, there is provided a method of forming the multilayer reflection electrode pattern, the method including: a resist film forming step of forming a resist film having a reverse pattern shape of the predetermined pattern on a film forming surface of a base material; a multilayer reflection electrode film forming step of forming the multilayer reflection electrode film including the Ag film and the transparent conductive oxide film on the film forming surface of the base material on which the resist film is formed; and a resist film removing step of removing the resist film.

In the method of forming the multilayer reflection electrode pattern having the above-described configuration, the resist film is formed on the film forming surface of the base material in a reverse pattern shape of the predetermined pattern, and the multilayer reflection electrode film is formed on the film forming surface of the base material on which the resist film is formed. As a result, in a case where the resist film is removed from the base material after the formation of the multilayer reflection electrode film, the multilayer reflection electrode film remains only in a region the resist film is not formed, and the multilayer reflection electrode pattern including the predetermined pattern can be formed. Therefore, it is not necessary to perform the etching step, and the predetermined pattern can be accurately formed. In addition, alkali resistance of the transparent conductive oxide film is improved due to the addition of one element or two or more elements selected from the group consisting of Sn, Y, and Ti. Therefore, even in a case where the resist film is removed using the alkaline resist remover in the resist film removing step, deterioration of the characteristics of the multilayer reflection electrode pattern can be prevented.

Advantageous Effects of Invention

According to the present disclosure, it is possible to provide: a multilayer reflection electrode film having a high reflectance in a visible range, in particular, in a blue wavelength range and having a low resistance value with which a fine electrode pattern can be easily formed using an etching method; a multilayer reflection electrode pattern formed of the multilayer reflection electrode film; and a method of forming the multilayer reflection electrode pattern.

BEST MODE FOR CARRYING OUT THE INVENTION

Hereinafter, a multilayer reflection electrode film according to an embodiment of the present disclosure will be described with reference to the accompanying drawings.

A multilayer reflection electrode film 10 according to the embodiment is used as an anode of an organic EL element and particularly is used as an anode of a top emission type organic EL element.

Figure 1:
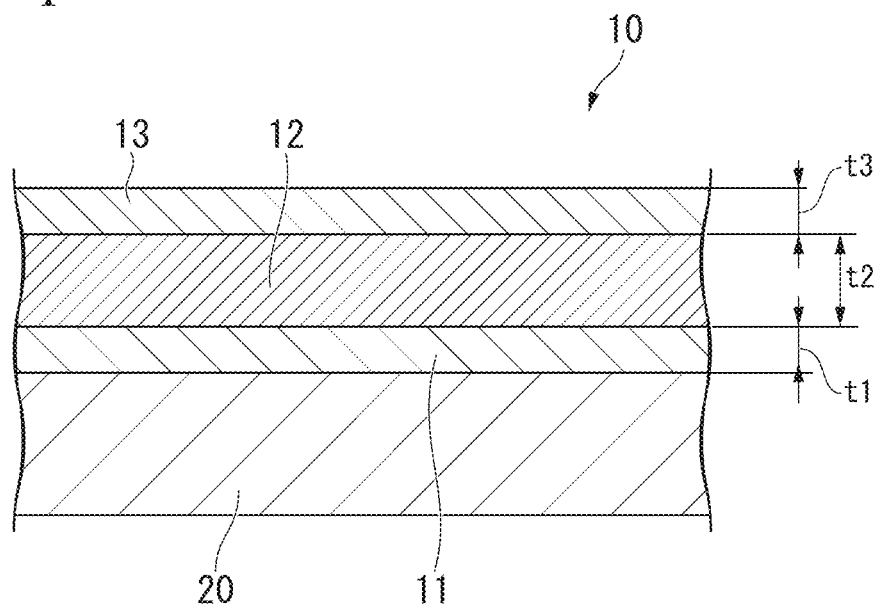
FIG. 1 is a partially enlarged cross-sectional view showing a multilayer reflection electrode film according to an embodiment of the present disclosure.

The multilayer reflection electrode film 10 according to the embodiment is shown in FIG. 1. For example, the multilayer reflection electrode film 10 includes: an underlayer oxide film 11 that is formed as an underlayer on one surface of a substrate 20 as a base material; a Ag film 12 that is formed on the underlayer oxide film 11; and a transparent conductive oxide film 13 that is formed on the Ag film 12. As the substrate 20, for example, a glass substrate or a resin film can be used.

In the multilayer reflection electrode film 10 having the above-described configuration, the reflectance in a visible range, in particular, in a blue wavelength range is high, and the resistance value is low. Specifically, the average reflectance of the multilayer reflection electrode film 10 in a visible range (wavelength range of 400 to 800 nm) is preferably 95% or higher and more preferably 96% or higher. In addition, the average reflectance of the multilayer reflection electrode film 10 in a blue wavelength range (wavelength range of 400 to 500 nm) is preferably 86% or higher and more preferably 88% or higher. The higher the average transmittance, the better. Therefore, the upper limit value is not particularly limited. The reflectance in a visible range (wavelength range of 400 to 800 nm) is preferably 99% or lower and more preferably 98% or lower. In addition, the reflectance in a blue wavelength range (wavelength range of 400 to 500 nm) is preferably 95% or lower and more preferably 90% or lower. In addition, the sheet resistance value of multilayer reflection electrode film 10 is preferably 1.0 Ω/sq. or lower and more preferably 0.5 Ω/sq. or lower. The lower the sheet resistance value of the multilayer reflection electrode film 10, the better. Therefore, the lower limit value is not particularly limited but is preferably 0.1 Ω/sq. and more preferably 0.2 Ω/sq.

The underlayer oxide film 11 is formed of an oxide. The underlayer oxide film 11 has an effect of suppressing penetration of moisture or sulfur into the Ag film 12 to suppress deterioration of the Ag film 12. In addition, the underlayer oxide film 11 has higher adhesiveness with the Ag film 12 than the substrate 20, and thus has an effect of preventing peeling of the Ag film 12. As an oxide forming the underlayer oxide film 11, the same oxide as that forming the transparent conductive oxide film 13 can be used. However, the composition of the oxide forming the underlayer oxide film 11 is not necessarily the same as that of the transparent conductive oxide film 13.

In the embodiment, the underlayer oxide film 11 is formed of the same oxide as that forming the transparent conductive oxide film 13.

The Ag film 12 is formed of Ag or an Ag alloy. Ag or the Ag alloy forming the Ag film 12 may be pure Ag having a purity of 99.9 mass % or higher or an Ag alloy including additive elements such as Cu, In, Sn, Sb, Ti, Mg, Zn, Ge, Al, Ga, Pd, Au, Pt, Bi, Mn, Sc, Y, Nd, Sm, Eu, Gd, Tb, and Er. From the viewpoint of suppressing a decrease in the reflectance of the Ag film 12 in a visible range and an increase in electrical resistance, the content of the additive elements is preferably 2.0 at % or lower.

In the embodiment, the Ag film 12 is formed of an Ag alloy including 0.2 at % to 2.0 at % of one element or two or more elements in total selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er and a balance of Ag and inevitable impurities.

In the embodiment, Cu, In, Sn, Sb, Ti, Mg, Zn, Ge, Al, Ga, Pd, Au, Pt, Bi, Mn, Sc, Y, Nd, Sm, Eu, Gd, Tb, and Er included in the Ag alloy forming the Ag film 12 are elements having an effect of improving sulfur resistance or heat resistance of the Ag film 12, and can suppress aggregation in a forming process of the Ag film 12 or deterioration in an usage environment of the Ag film 12.

Here, in a case where the total content of one element or two or more elements selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er is lower than 0.2 at %, the above-described effect may not be sufficiently exhibited. On the other hand, in a case where the total content of one element or two or more elements selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er is higher than 2.0 at %, the reflectance of the Ag film 12 may decrease and the resistance value may increase.

Due to the above-described reasons, in the embodiment, the total content of one element or two or more elements selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er in the Ag alloy forming the Ag film 12 is in a range of 0.2 at % to 2.0 at %.

In order to reliably exhibit the above-described effect, the lower limit of the total content of one element or two or more elements selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er in the Ag alloy forming the Ag film 12 is preferably 0.3 at % or higher and more preferably 0.5 at % or higher. On the other hand, in order to suppress a decrease in transmittance and an increase in resistivity, the upper limit of the total content of one element or two or more elements selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er is preferably 1.8 at % or lower and more preferably 1.5 at % or lower.

In the embodiment, the transparent conductive oxide film 13 is formed of an oxide that includes Zn and Ga and further includes one element or two or more elements selected from the group consisting of Sn, Y, and Ti. That is, the transparent conductive oxide film 13 is formed of a Zn oxide to which Ga and one element or two or more elements selected from the group consisting of Sn, Y, and Ti are added.

In the embodiment, the atomic proportion of Ga and the atomic proportion of one element or two or more elements selected from the group consisting of Sn, Y, and Ti with respect to all the metal elements included in the transparent conductive oxide film 13 are Ga: 0.5 at % to 30.0 at % and each of Sn, Y, and Ti: 0.1 at % to 10.0 at %.

Here, the Ga content (the atomic proportion of Ga with respect to all the metal elements) with respect to all the metal elements included in transparent conductive oxide film 13 is 0.5 at % or higher. As a result, adhesiveness between the Ag film 12 and the transparent conductive oxide film 13 can be improved, and an increase in the electrical resistance of the transparent conductive oxide film 13 can be prevented. On the other hand, by adjusting the Ga content to be 30.0 at % or lower, an increase in the electrical resistance of the transparent conductive oxide film 13 can be prevented.

In order to prevent an increase in the electrical resistance of the transparent conductive oxide film 13, the lower limit of the Ga content is preferably 1.0 at % or higher and more preferably 2.0 at % or higher. In addition, in order to reliably prevent an increase in the electrical resistance of the transparent conductive oxide film 13, the upper limit of the Ga content is preferably 25.0 at % or lower, more preferably 20.0 at % or lower, still more preferably 18.0 at % or lower, and even still more preferably 14.0 at % or lower.

In addition, by adjusting each of the contents of Sn, Y, and Ti with respect to all the metal elements included in the transparent conductive oxide film 13 to be 0.1 at % or higher, alkali resistance and environment resistance of the transparent conductive oxide film 13 can be improved. On the other hand, by adjusting each of the contents of Sn, Y, and Ti to be 10.0 at % or lower, an increase in the electrical resistance of the transparent conductive oxide film 13 can be prevented. Further, in order to further improve the effect of improving alkali resistance, it is preferable that the transparent conductive oxide film 13 further includes Y.

In order to reliably improve the alkali resistance and environment resistance of the transparent conductive oxide film 13, the lower limit of each of the contents of Sn, Y, and Ti is preferably 0.2 at % or higher and more preferably 0.5 at % or higher. In order to reliably prevent an increase in the electrical resistance of the transparent conductive oxide film 13, the upper limit of each of the contents of Sn, Y, and Ti is preferably 9.0 at % or lower and more preferably 8.0 at % or lower.

In addition, in order to reliably prevent an increase in the electrical resistance of the transparent conductive oxide film 13, the total content of Ga, Sn, Y, and Ti is preferably 35.0 at % or lower, more preferably 30.0 at % or lower, and still more preferably 25.0 at % or lower.

Here, in the embodiment, in order to improve the reflectance, a thickness t2 of the Ag film 12 is set to be 50 nm or more. In order to further improve the reflectance, the thickness t2 of the Ag film 12 is preferably 60 nm or more and more preferably 80 nm or more. The upper limit value of the thickness t2 of the Ag film 12 is not particularly limited. However, the thickness t2 of the Ag film 12 is preferably 200 nm or less and more preferably 150 nm or less.

In order to improve the transmittance, a thickness t3 of the transparent conductive oxide film 13 is set to be 100 nm or less. In order to further improve the transmittance, the thickness t3 of the transparent conductive oxide film 13 is preferably 80 nm or less and more preferably 50 nm or less. In addition, the lower limit of t3 of the transparent conductive oxide film 13 is preferably 5 nm.

A thickness t1 of the underlayer oxide film 11 is not particularly limited and may be the same as the thickness t3 of the transparent conductive oxide film 13.

Figure 3:
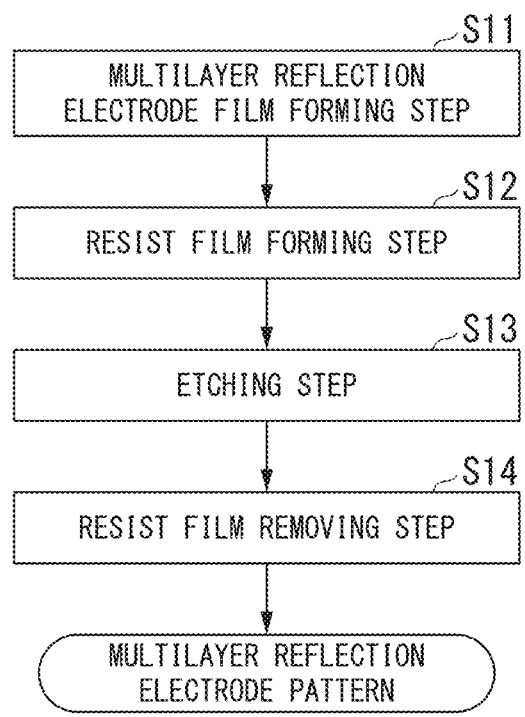
FIG. 3 is a flowchart showing a method of forming the multilayer reflection electrode pattern according to the embodiment of the present disclosure.
Figure 4:
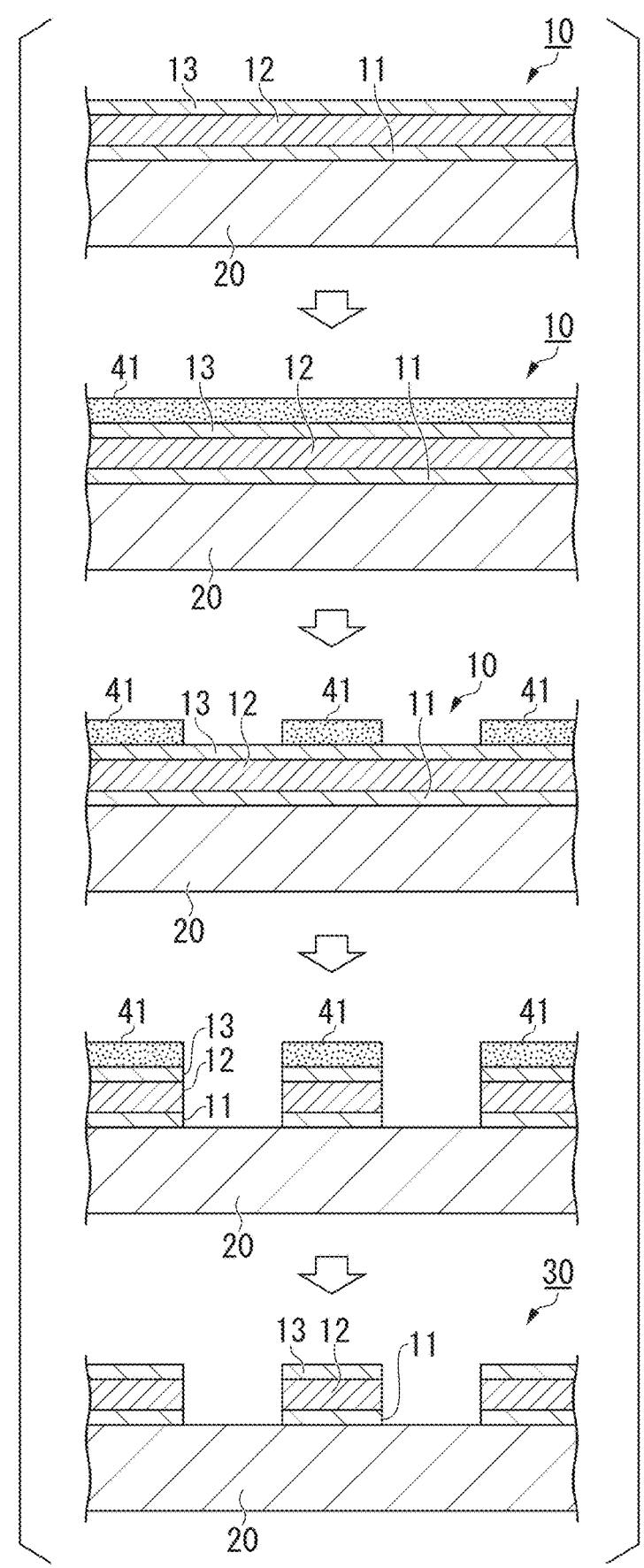
FIG. 4 is a diagram showing the method of forming the multilayer reflection electrode pattern shown in FIG. 3.

Next, a multilayer reflection electrode pattern 30 according to the embodiment of the present disclosure and a method of forming the multilayer reflection electrode pattern 30 will be described with reference to FIGS. 2 to 4.

Figure 2:
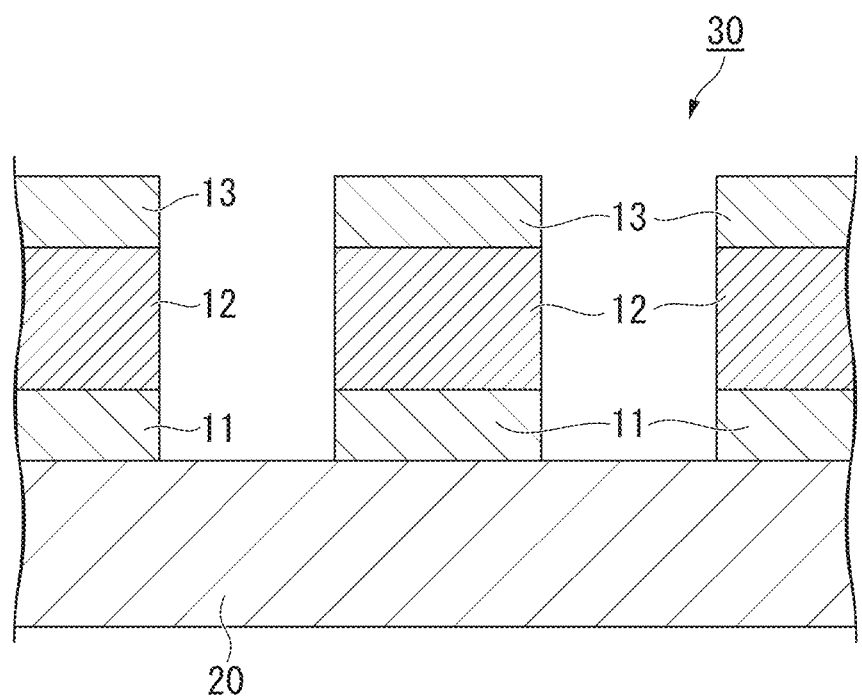
FIG. 2 is a partially enlarged cross-sectional view showing a multilayer reflection electrode pattern according to the embodiment of the present disclosure.

In the multilayer reflection electrode pattern 30 according to the embodiment, as shown in FIG. 2, a predetermined pattern is formed on the multilayer reflection electrode film 10 shown in FIG. 1. Here, in the pattern of the multilayer reflection electrode pattern 30 according to the embodiment, for example, a plurality of rectangular electrode units having one side length in a range of 10 μm to 500 μm are arranged on the substrate.

Here, the multilayer reflection electrode pattern 30 is formed as follows.

First, the multilayer reflection electrode film 10 according to the embodiment is formed on a film forming surface of the substrate 20 as a base material (multilayer reflection electrode film forming step S11).

In the multilayer reflection electrode film forming step S11, the underlayer oxide film 11 is formed as an underlayer on the substrate 20. It is preferable that the underlayer oxide film 11 is formed by DC sputtering using a sintered target with which the film composition can be easily controlled. Next, the Ag film 12 is formed on the formed underlayer oxide film 11 by DC sputtering using an Ag target. The Ag target has a composition corresponding to the composition of the formed Ag film 12. The transparent conductive oxide film 13 is formed on the formed Ag film 12 by DC sputtering using a transparent conductive oxide target. It is preferable that the transparent conductive oxide target is a sintered target with which the film composition can be easily controlled. This way, the multilayer reflection electrode film 10 according to the embodiment is formed.

Next, a resist film 41 is formed on the multilayer reflection electrode film 10 formed on the surface of the substrate 20, and the resist film 41 is exposed and developed. As a result, a multilayer reflection electrode pattern is formed (resist film forming step S12).

Next, the multilayer reflection electrode film 10 on which the resist film 41 is formed is collectively etched by using an acidic mixed solution including phosphoric acid and acetic acid as an etchant (etching step S13). Here, in the acidic mixed solution including phosphoric acid and acetic acid, it is preferable that the content of the phosphoric acid is 55 vol % or lower and the content of the acetic acid is 30 vol % or lower. The mixed solution may include 20 vol % or lower of nitric acid in addition to phosphoric acid and acetic acid.

Next, the resist film 41 is removed using an alkaline resist remover (resist film removing step S14).

As a result, the multilayer reflection electrode film 10 positioned below the resist film 41 having a multilayer reflection electrode pattern shape remains, and the multilayer reflection electrode pattern 30 including the predetermined pattern is formed.

In the multilayer reflection electrode film 10 according to the embodiment having the above-described configuration, the underlayer oxide film 11 is formed as an underlayer on the surface of the substrate 20, and the Ag film 12 is formed on the underlayer oxide film 11. Therefore, penetration of moisture or sulfur into the Ag film 12 can be suppressed, and deterioration of the Ag film 12 can be suppressed for a long period of time.

In the underlayer oxide film 11 and the transparent conductive oxide film 13 according to the embodiment, Ga and one element or two or more elements selected from the group consisting of Sn, Y, and Ti are added to a Zn oxide, and atomic proportions with respect to all the metal elements included in each of the oxide films are Ga: 0.5 at % to 30.0 at %, each of Sn, Y, and Ti: 0.1 at % to 10.0 at %, and a balance of Zn. Therefore, due to the addition of Ga, adhesiveness between the Ag film 12 and the transparent conductive oxide film 13 can be improved, and an increase in electrical resistance can be suppressed. In addition, alkali resistance can be improved due to the addition of Sn, Y, and Ti. Further, the underlayer oxide film 11 and the transparent conductive oxide film 13 can suppress penetration of moisture or sulfur into the Ag film 12 to suppress deterioration of the Ag film 12.

In addition, in the embodiment, the Ag film 12 is formed of an Ag alloy including 0.2 at % to 2.0 at % of one element or two or more elements in total selected from the group consisting of Cu, in, Sn, Sb, Ti, Mg, Zn, Ge, Al, Ga, Pd, Au, Pt, Bi, Mn, Sc, Y, Nd, Sm, Eu, Gd, Tb, and Er and a balance of Ag and inevitable impurities. Therefore, sulfur resistance, heat resistance, or the like of the Ag film can be improved, and deterioration can be prevented. As a result, the Ag film 12 can be stably used for a long period of time.

In addition, in the multilayer reflection electrode pattern 30 according to the embodiment, a predetermined pattern is formed on the multilayer reflection electrode film 10 according to the embodiment. Therefore, the multilayer reflection electrode pattern 30 has a high reflectance in a visible range, in particular, in a blue wavelength range, and a low resistance value.

In general, an organic EL display forms an image by combining blue light, green light, and red light emitted from an organic EL element that emits blue light, an organic EL element that emits green light, an organic EL element that emits red light, respectively. Therefore, in a case where the reflectance of the anode in a blue wavelength range is lower than that in a green wavelength range or red wavelength range, the emission amount of blue light increases, and thus it is necessary to increase the power input to the organic EL element that emits blue light. However, in a case where a large amount of power is input to the organic EL element that emits blue light, deterioration is likely to progress, and the emission amount of blue light decreases due to the deterioration of the organic EL element that emits blue light. As a result, a color balance of the organic EL display as a whole may deteriorate. On the other hand, the multilayer reflection electrode pattern 30 according to the embodiment has high reflectance with respect to light in a blue wavelength range. Therefore, it is not necessary to input a large amount of power to the organic EL element that emits blue light, and deterioration of the organic EL element is suppressed. As a result, a color balance of the organic EL display as a whole is stable for a long period of time.

Further, in the embodiment, in a case where the acidic mixed solution including phosphoric acid and acetic acid is used as an etchant in the etching step S13, a difference in etching rate between the Ag film 12, the underlayer oxide film 11, and the transparent conductive oxide film 13 is small. Therefore, even in a case where the multilayer reflection electrode film 10 is collectively etched, the over-etching of the Ag film 12 or the remaining of residues of the underlayer oxide film 11 and the transparent conductive oxide film 13 can be prevented, and the multilayer reflection electrode pattern 30 can be accurately formed.

In addition, in the embodiment, alkali resistance of the transparent conductive oxide film 13 is improved due to the addition of one element or two or more elements selected from the group consisting of Sn, Y, and Ti. Therefore, even in a case where the resist film is removed using the alkaline resist remover in the resist film removing step S14, deterioration of the characteristics of the multilayer reflection electrode pattern can be prevented.

Hereinabove, the embodiment of the present disclosure has been described. However, the present disclosure is not limited to the embodiment, and various modifications can be made within a range not departing from the technical ideas of the present disclosure.

For example, in the above description of the embodiment, the Ag film 12 is formed of an Ag alloy including 0.2 at % to 2.0 at % of one element or two or more elements in total selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er and a balance of Ag and inevitable impurities. However, the Ag film 12 is not limited to this configuration, and may be formed of pure Ag or an Ag alloy including another metal element that is solid-soluble in Ag.

In addition, in the above description of the embodiment, the underlayer oxide film 11 is formed of the same oxide as that forming the transparent conductive oxide film 13. However, the embodiment is not limited to this configuration. For example, the underlayer oxide film 11 may be formed of ZnO or AZO. It is preferable that the underlayer oxide film 11 is formed of an oxide having a small difference in etching rate from the Ag film 12 and the transparent conductive oxide film 13.

Further, in the embodiment, the underlayer oxide film 11 is disposed as an underlayer between the substrate 20 and the Ag film 12. However, the embodiment is not limited to this configuration, and the Ag film 12 may be directly disposed on the surface of the substrate 20.

Further, in the above description of the embodiment, the multilayer reflection electrode pattern 30 is formed using an etching method. However, the embodiment is not limited to this configuration, and the multilayer reflection electrode pattern 30 may be formed using a lift-off method as shown in FIGS. 5 and 6.

Figure 5:
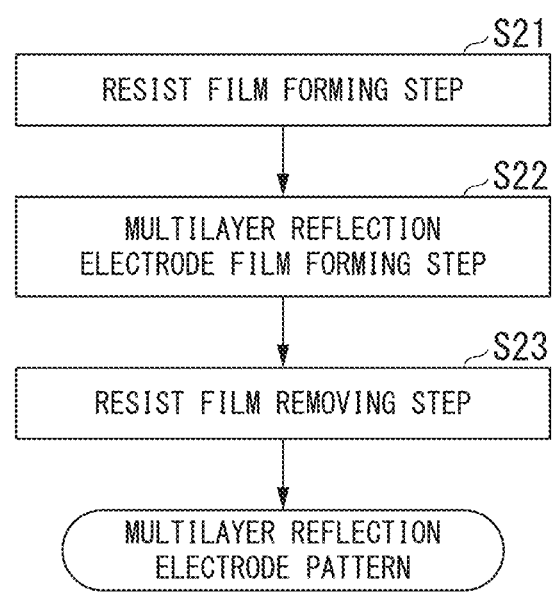
FIG. 5 is a flowchart showing a method of forming a multilayer reflection electrode pattern according to another embodiment of the present disclosure.
Figure 6:
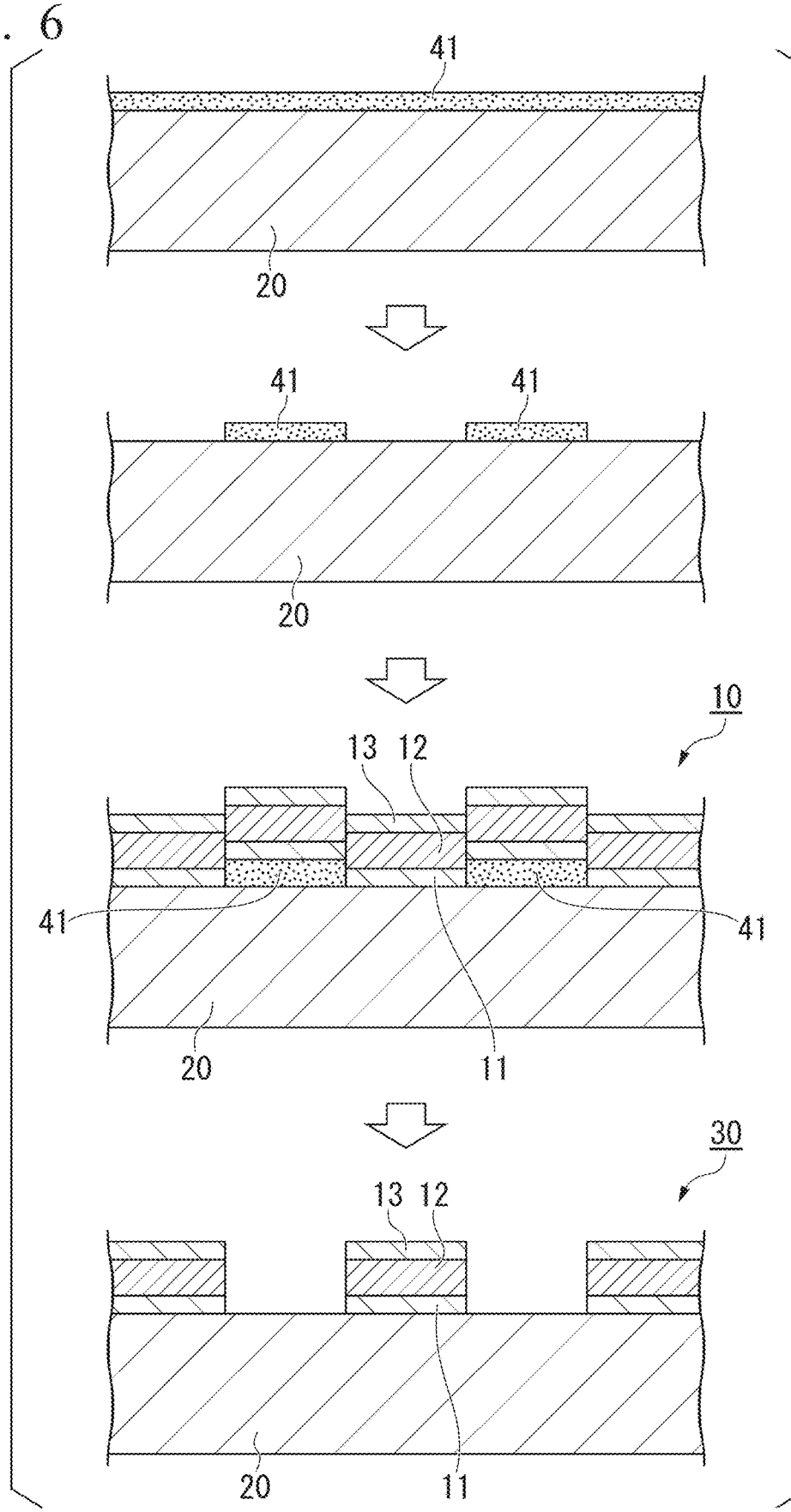
FIG. 6 is a diagram showing the method of forming the multilayer reflection electrode pattern shown in FIG. 5.

In the method of forming the multilayer reflection electrode pattern 30 shown in FIGS. 5 and 6, first, the resist film 41 is formed on the film forming surface of the substrate 20, and the resist film 41 is exposed and developed. As a result, a reverse pattern having a reverse pattern shape of the multilayer reflection electrode pattern is formed (resist film forming step S21).

Next, the underlayer oxide film 11, the Ag film 12, and the transparent conductive oxide film 13 are sequentially formed using a sputtering method on the substrate 20 on which the resist film 41 including the reverse pattern is formed. As a result, the multilayer reflection electrode film 10 is formed on the resist film 41 and the substrate 20 (the multilayer reflection electrode film forming step S22).

Next, the resist film 41 is removed using an alkaline resist remover (resist film removing step S23).

As a result, the multilayer reflection electrode film 10 formed on the resist film 41 having the reverse pattern shape is removed, and the multilayer reflection electrode pattern 30 including the predetermined pattern is formed.

According to the method of forming the multilayer reflection electrode pattern 30 having the above-described configuration, the predetermined pattern can be accurately formed without performing the etching step. In addition, alkali resistance of the transparent conductive oxide film 13 is improved due to the addition of one element or two or more elements selected from the group consisting of Sn, Y, and Ti. Therefore, even in a case where the resist film is removed using the alkaline resist remover in the resist film removing step S23, deterioration of the characteristics of the multilayer reflection electrode pattern 30 can be prevented.

Examples

The results of an experiment for verifying the effect of the multilayer reflection electrode film according to the present disclosure will be described.

Each of multilayer reflection electrode films having structures shown in Tables 1 to 5 was formed on a surface of a glass substrate (non-alkali glass: 50 mm×50 mm×1 mmt) using a sputtering method.

The thicknesses of the Ag film and the transparent conductive oxide films in each of Examples according to the present disclosure and Comparative Examples were measured using a film thickness meter (DEKTAK, manufactured by ULVAC Inc.).

In addition, the compositions of the transparent conductive oxide films and the Ag alloy film were obtained by performing elemental quantitative analysis using an ICP atomic emission spectrometer (STS-3500DD, manufactured by Hitachi High-Tech Science Corporation).

In order to prepare the underlayer oxide film and the transparent conductive oxide film, oxide sintered body targets having compositions shown in Tables 1 to 5 were used.

In order to prepare the Ag films, pure Ag or Ag alloy targets having compositions shown in Tables 1 to 5 were used.

In each of Comparative Examples, the composition of the ITO film (an oxide obtained by adding Sn to $In_2O_3$) shown in Table 5 was In: 35.6 at %, Sn: 3.6 at %, and O: 60.8 at %. In Comparative Examples, although not shown in the tables, multilayer reflection electrode films including a GZO film (a composition of the film includes Zn: 47.3 at %, Ga: 2.2 at %, and O: 50.5 at %) instead of the ITO film in the compositions of Comparative Examples 1 to 5 were also prepared.

Film forming conditions of each of the films are as follows.

<Film Forming Conditions of Underlayer Oxide Film and Transparent Conductive Oxide Film>

Sputtering device: a DC magnetron sputtering device (CS-200, manufactured by ULVAC Inc.)

Magnetic field intensity: 1000 Gauss (immediately above the target, vertical component)

Peak vacuum degree: $5 \times 10^{-5}$ Pa or lower

Sputtering gas: mixed gas of $Ar+O_2$ (mixing ratio of $O_2$:2%)

Sputtering gas pressure: 0.4 Pa

Sputtering power: DC 100 W

<Film Forming Conditions of Ag Film>

Sputtering device: a DC magnetron sputtering device (CS-200, manufactured by ULVAC Inc.)

Magnetic field intensity: 1000 Gauss (immediately above the target, vertical component)

Peak vacuum degree: $5 \times 10^{-5}$ Pa or lower

Sputtering gas: Ar

Sputtering gas pressure: 0.5 Pa

Sputtering power: DC 100 W

Regarding the obtained multilayer reflection electrode film, a sheet resistance and a reflectance were evaluated.

Further, regarding the obtained multilayer reflection electrode film, a patterning test using an etching method and a patterning test using a lift-off method were performed.

The evaluation methods are as follows.

<Sheet Resistance>

Using a surface resistance meter (Loresta AP MCP-T400, manufactured by Mitsubishi Chemical Corporation), a sheet resistance was measured according to a four-point probe method. The measurement results are shown in Tables 6 to 10.

<Reflectance>

Using a spectrophotometer (U4100, manufactured by Hitachi High-Technologies Corporation), a reflectance spectrum in a wavelength range of 400 nm to 800 nm was measured to obtain an average reflectance in a blue wavelength range (400 to 500 nm) and an average reflectance in a visible range (400 to 800 nm). The measurement results are shown in Tables 6 to 10.

<Patterning Test using Etching Method>

A resist film was formed on the multilayer reflection electrode film using a photolithography method in an electrode pattern shape (line width/space width: 30 μm/30 μm). The multilayer transparent conductive film was collectively etched using a mixed solution (SEA-5, manufactured by Kanto Kagaku) including phosphoric acid and acetic acid as an etchant. Etching was performed for an appropriate etching time (20 seconds to 240 seconds) without heating. In addition, in the mixed solution, the content of the phosphoric acid was 55 vol % or lower, and the content of the acetic acid was 30 vol %. Next, the resist film was removed using an alkaline resist remover (pH9, TOK-104, manufactured by Tokyo Ohka Kogyo Co., Ltd.) to form an electrode pattern, and the formed electrode pattern was observed using an optical microscope (laser microscope VK-X200, manufactured by Keyence Corporation) at a magnification of 50 times to determine whether or not residues of the transparent conductive oxide film 13 were present. Specifically, in a case where the presence of the transparent conductive oxide film remaining in a needle shape or a particle shape without being etched was recognized, it was determined the residues of the transparent conductive oxide film 13 were present. Otherwise, it was determined that the residues of the transparent conductive oxide film 13 were not present.

Figure 7:
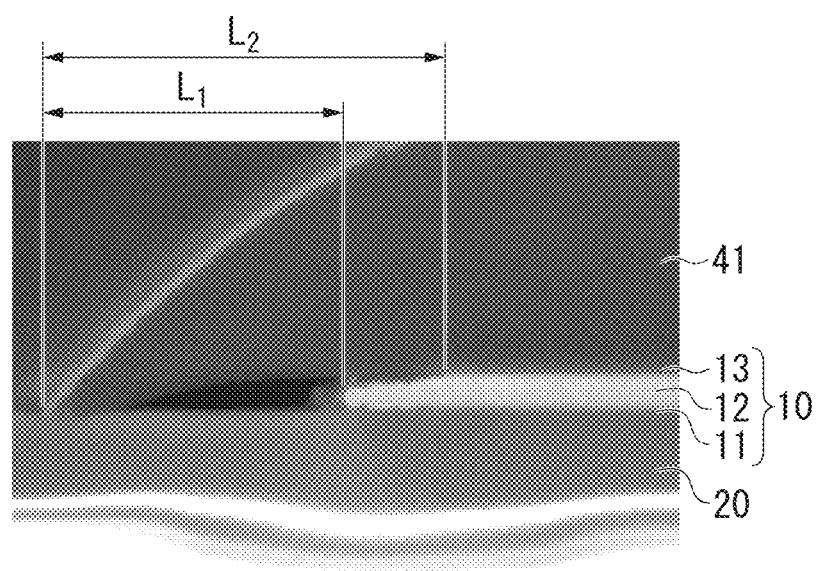
FIG. 7 is an observation image showing an example of the results of a multilayer reflection electrode film formed in Example 2 after a patterning test using an etching method.

In addition, a cross-section (a cross-section perpendicular to the film forming surface of the substrate 20 perpendicular to the line and the space) of the electrode pattern before removing the resist film was observed using a scanning electron microscope (SU8000, manufactured by Hitachi High-Technologies Corporation) at a magnification of 50000 times. FIG. 7 shows the result of observing a cross-sectional shape of the electrode pattern obtained in the patterning test in which the multilayer reflection electrode film formed in Example 2 was used. As shown in FIG. 7, a length of $L_1$ of the Ag film 12 that was etched up to the inside of the resist film 41 and a length $L_2$ of the transparent conductive oxide film 13 were measured, and a difference between the length $L_1$ and the length $L_2$ was calculated as the length of over-etching. The length $L_1$ is the length between an end portion of the resist film 41 and an end portion of the Ag film 12 in a direction parallel to the film forming surface of the substrate 20. The length $L_2$ is the length between an end portion of the resist film 41 and an end portion of the transparent conductive oxide film 13 in the direction parallel to the film forming surface of the substrate 20. In order to measure the lengths $L_1$ and $L_2$, a boundary portion (edge portion) between the substrate 20 and a resist pattern in which the multilayer reflection electrode film 10 was desired to remain was set as the end portion of the resist film 41, an end portion of the Ag film 12 in the multilayer reflection electrode film 10 remaining between the resist pattern and the substrate 20 was set as the end portion of the Ag film 12, and an end portion of the transparent conductive oxide film 13 in the remaining multilayer reflection electrode film 10 was set as the end portion of the transparent conductive oxide film 13. The lengths of over-etching of respective samples of Examples and Comparative Examples are shown in Tables 6 to 10. Each of the lengths of over-etching in Tables 6 to 10 are a value of the length L obtained by observing one cross-section.

<Patterning Test Using Lift-Off Method>

In addition, a resist solution was applied to the substrate, a photomask on which an electrode pattern (line width/space width: 30 μm/30 μm) was formed was attached thereto, and the substrate was exposed to ultraviolet light using an exposure machine.

Next, the exposed portion was removed using a developer, and a reverse pattern was formed using a photolithography method.

Next, the multilayer reflection electrode film was formed using the sputtering device as described above on the substrate on which the reverse pattern was formed. Next, the substrate was dipped in a resist remover (ph9, TOK-104, manufactured by Tokyo Ohka Kogyo Co., Ltd.) to remove the multilayer reflection electrode film formed on the resist film, and then the formed electrode pattern was observed using an optical microscope (laser microscope VK-X200, manufactured by Keyence Corporation) at a magnification of 50 times to measure the accuracy of the electrode pattern. In a case where film peeling or resist residues were observed in the line (P), it was determined that the electrode pattern was not accurately formed. Otherwise, it was determined that the electrode pattern was accurately formed.

TABLE 1

| | | Underlayer Oxide Film | | | | | | Ag Film | | Transparent Conductive Oxide Film | | | | | |
|---|---|---|---|---|---|---|---|---|---|---|---|---|---|---|---|
| | | at % with respect to All Metal Components | | | | | Thickness | | Thickness | at % with respect to All Metal Components | | | | | Thickness |
| | | Zn | Ga | Ti | Sn | Y | (nm) | Composition | (nm) | Zn | Ga | Ti | Sn | Y | (nm) |
| Example | 1 | Balance | 14.0 | 2.0 | 2.0 | 1.0 | 10 | Ag-0.2 at % Cu | 100 | Balance | 14.0 | 2.0 | 2.0 | 1.0 | 10 |
| | 2 | Balance | 14.0 | 2.0 | 2.0 | 1.0 | 10 | Ag-1.0 at % Cu | 100 | Balance | 14.0 | 2.0 | 2.0 | 1.0 | 10 |
| | 3 | Balance | 14.0 | 2.0 | 2.0 | 1.0 | 10 | Ag-2.0 at % Cu | 100 | Balance | 14.0 | 2.0 | 2.0 | 1.0 | 10 |
| | 4 | Balance | 14.0 | 2.0 | 2.0 | 1.0 | 10 | Ag-0.2 at % In | 100 | Balance | 14.0 | 2.0 | 2.0 | 1.0 | 10 |
| | 5 | Balance | 14.0 | 2.0 | 2.0 | 1.0 | 10 | Ag-1.0 at % In | 100 | Balance | 14.0 | 2.0 | 2.0 | 1.0 | 10 |
| | 6 | Balance | 14.0 | 2.0 | 2.0 | 1.0 | 10 | Ag-2.0 at % In | 100 | Balance | 14.0 | 2.0 | 2.0 | 1.0 | 10 |
| | 7 | Balance | 14.0 | 2.0 | 2.0 | 1.0 | 10 | Ag-0.2 at % Sn | 100 | Balance | 14.0 | 2.0 | 2.0 | 1.0 | 10 |
| | 8 | Balance | 14.0 | 2.0 | 2.0 | 1.0 | 10 | Ag-1.0 at % Sn | 100 | Balance | 14.0 | 2.0 | 2.0 | 1.0 | 10 |
| | 9 | Balance | 14.0 | 2.0 | 2.0 | 1.0 | 10 | Ag-2.0 at % Sn | 100 | Balance | 14.0 | 2.0 | 2.0 | 1.0 | 10 |
| | 10 | Balance | 14.0 | 2.0 | 2.0 | 1.0 | 10 | Ag-0.2 at % Sb | 100 | Balance | 14.0 | 2.0 | 2.0 | 1.0 | 10 |
| | 11 | Balance | 14.0 | 2.0 | 2.0 | 1.0 | 10 | Ag-1.0 at % Sb | 100 | Balance | 14.0 | 2.0 | 2.0 | 1.0 | 10 |
| | 12 | Balance | 14.0 | 2.0 | 2.0 | 1.0 | 10 | Ag-2.0 at % Sb | 100 | Balance | 14.0 | 2.0 | 2.0 | 1.0 | 10 |
| | 13 | Balance | 14.0 | 2.0 | 2.0 | 1.0 | 10 | Ag-0.2 at % Ti | 100 | Balance | 14.0 | 2.0 | 2.0 | 1.0 | 10 |
| | 14 | Balance | 14.0 | 2.0 | 2.0 | 1.0 | 10 | Ag-1.0 at % Ti | 100 | Balance | 14.0 | 2.0 | 2.0 | 1.0 | 10 |
| | 15 | Balance | 14.0 | 2.0 | 2.0 | 1.0 | 10 | Ag-2.0 at % Ti | 100 | Balance | 14.0 | 2.0 | 2.0 | 1.0 | 10 |
| | 16 | Balance | 30.0 | 0.1 | 0.1 | 0.1 | 10 | Ag-1.0 at % Cu | 100 | Balance | 30.0 | 0.1 | 0.1 | 0.1 | 10 |
| | 17 | Balance | 30.0 | 0.1 | 0.1 | 0.1 | 10 | Ag-1.0 at % In | 100 | Balance | 30.0 | 0.1 | 0.1 | 0.1 | 10 |
| | 18 | Balance | 30.0 | 0.1 | 0.1 | 0.1 | 10 | Ag-1.0 at % Sn | 100 | Balance | 30.0 | 0.1 | 0.1 | 0.1 | 10 |
| | 19 | Balance | 30.0 | 0.1 | 0.1 | 0.1 | 10 | Ag-1.0 at % Sb | 100 | Balance | 30.0 | 0.1 | 0.1 | 0.1 | 10 |
| | 20 | Balance | 30.0 | 0.1 | 0.1 | 0.1 | 10 | Ag-1.0 at % Ti | 100 | Balance | 30.0 | 0.1 | 0.1 | 0.1 | 10 |
| | 21 | Balance | 0.5 | 10.0 | 10.0 | 10.0 | 10 | Ag-1.0 at % Cu | 100 | Balance | 0.5 | 10.0 | 10.0 | 10.0 | 10 |
| | 22 | Balance | 0.5 | 10.0 | 10.0 | 10.0 | 10 | Ag-1.0 at % In | 100 | Balance | 0.5 | 10.0 | 10.0 | 10.0 | 10 |
| | 23 | Balance | 0.5 | 10.0 | 10.0 | 10.0 | 10 | Ag-1.0 at % Sn | 100 | Balance | 0.5 | 10.0 | 10.0 | 10.0 | 10 |
| | 24 | Balance | 0.5 | 10.0 | 10.0 | 10.0 | 10 | Ag-1.0 at % Sb | 100 | Balance | 0.5 | 10.0 | 10.0 | 10.0 | 10 |
| | 25 | Balance | 0.5 | 10.0 | 10.0 | 10.0 | 10 | Ag-1.0 at % Ti | 100 | Balance | 0.5 | 10.0 | 10.0 | 10.0 | 10 |
| | 26 | Balance | 14.0 | 0.0 | 2.5 | 0.0 | 10 | Ag-1.0 at % Cu | 100 | Balance | 14.0 | 0.0 | 2.5 | 0.0 | 10 |
| | 27 | Balance | 14.0 | 0.0 | 2.5 | 0.0 | 10 | Ag-1.0 at % In | 100 | Balance | 14.0 | 0.0 | 2.5 | 0.0 | 10 |
| | 28 | Balance | 14.0 | 0.0 | 2.5 | 0.0 | 10 | Ag-1.0 at % Sn | 100 | Balance | 14.0 | 0.0 | 2.5 | 0.0 | 10 |
| | 29 | Balance | 14.0 | 0.0 | 2.5 | 0.0 | 10 | Ag-1.0 at % Sb | 100 | Balance | 14.0 | 0.0 | 2.5 | 0.0 | 10 |
| | 30 | Balance | 14.0 | 0.0 | 2.5 | 0.0 | 10 | Ag-1.0 at % Ti | 100 | Balance | 14.0 | 0.0 | 2.5 | 0.0 | 10 |

TABLE 2

| | | Underlayer Oxide Film | | | | | | Ag Film | | Transparent Conductive Oxide Film | | | | | |
|---|---|---|---|---|---|---|---|---|---|---|---|---|---|---|---|
| | | at % with respect to All Metal Components | | | | | Thickness | | Thickness | at % with respect to All Metal Components | | | | | Thickness |
| | | Zn | Ga | Ti | Sn | Y | (nm) | Composition | (nm) | Zn | Ga | Ti | Sn | Y | (nm) |
| Example | 31 | Balance | 14.0 | 0.0 | 0.0 | 2.5 | 10 | Ag-1.0 at % Cu | 100 | Balance | 14.0 | 0.0 | 0.0 | 2.5 | 10 |
| | 32 | Balance | 14.0 | 0.0 | 0.0 | 2.5 | 10 | Ag-1.0 at % In | 100 | Balance | 14.0 | 0.0 | 0.0 | 2.5 | 10 |
| | 33 | Balance | 14.0 | 0.0 | 0.0 | 2.5 | 10 | Ag-1.0 at % Sn | 100 | Balance | 14.0 | 0.0 | 0.0 | 2.5 | 10 |
| | 34 | Balance | 14.0 | 0.0 | 0.0 | 2.5 | 10 | Ag-1.0 at % Sb | 100 | Balance | 14.0 | 0.0 | 0.0 | 2.5 | 10 |
| | 35 | Balance | 14.0 | 0.0 | 0.0 | 2.5 | 10 | Ag-1.0 at % Ti | 100 | Balance | 14.0 | 0.0 | 0.0 | 2.5 | 10 |
| | 36 | Balance | 14.0 | 2.5 | 0.0 | 0.0 | 10 | Ag-1.0 at % Cu | 100 | Balance | 14.0 | 2.5 | 0.0 | 0.0 | 10 |
| | 37 | Balance | 14.0 | 2.5 | 0.0 | 0.0 | 10 | Ag-1.0 at % In | 100 | Balance | 14.0 | 2.5 | 0.0 | 0.0 | 10 |
| | 38 | Balance | 14.0 | 2.5 | 0.0 | 0.0 | 10 | Ag-1.0 at % Sn | 100 | Balance | 14.0 | 2.5 | 0.0 | 0.0 | 10 |
| | 39 | Balance | 14.0 | 2.5 | 0.0 | 0.0 | 10 | Ag-1.0 at % Sb | 100 | Balance | 14.0 | 2.5 | 0.0 | 0.0 | 10 |
| | 40 | Balance | 14.0 | 2.5 | 0.0 | 0.0 | 10 | Ag-1.0 at % Ti | 100 | Balance | 14.0 | 2.5 | 0.0 | 0.0 | 10 |
| | 41 | Balance | 14.0 | 2.0 | 2.0 | 1.0 | 10 | Ag-0.5 at % Cu-0.5 at % In | 100 | Balance | 14.0 | 2.0 | 2.0 | 1.0 | 10 |
| | 42 | Balance | 14.0 | 2.0 | 2.0 | 1.0 | 10 | Ag-0.5 at % Cu-0.5 at % Sn | 100 | Balance | 14.0 | 2.0 | 2.0 | 1.0 | 10 |
| | 43 | Balance | 14.0 | 2.0 | 2.0 | 1.0 | 10 | Ag-0.5 at % Cu-0.5 at % Sb | 100 | Balance | 14.0 | 2.0 | 2.0 | 1.0 | 10 |
| | 44 | Balance | 14.0 | 2.0 | 2.0 | 1.0 | 10 | Ag-0.5 at % Cu-0.5 at % Ti | 100 | Balance | 14.0 | 2.0 | 2.0 | 1.0 | 10 |
| | 45 | Balance | 14.0 | 2.0 | 2.0 | 1.0 | 10 | Ag-0.5 at % In-0.5 at % Sn | 100 | Balance | 14.0 | 2.0 | 2.0 | 1.0 | 10 |
| | 46 | Balance | 14.0 | 2.0 | 2.0 | 1.0 | 10 | Ag-0.5 at % In-0.5 at % Sb | 100 | Balance | 14.0 | 2.0 | 2.0 | 1.0 | 10 |
| | 47 | Balance | 14.0 | 2.0 | 2.0 | 1.0 | 10 | Ag-0.5 at % In-0.5 at % Ti | 100 | Balance | 14.0 | 2.0 | 2.0 | 1.0 | 10 |
| | 48 | Balance | 14.0 | 2.0 | 2.0 | 1.0 | 10 | Ag-0.5 at % Sn-0.5 at % Sb | 100 | Balance | 14.0 | 2.0 | 2.0 | 1.0 | 10 |
| | 49 | Balance | 14.0 | 2.0 | 2.0 | 1.0 | 10 | Ag-0.5 at % Sn-0.5 at % Ti | 100 | Balance | 14.0 | 2.0 | 2.0 | 1.0 | 10 |

TABLE 2-continued

| | | Underlayer Oxide Film | | | | | | Ag Film | | Transparent Conductive Oxide Film | | | | | |
|---|---|---|---|---|---|---|---|---|---|---|---|---|---|---|---|
| | | at % with respect to All Metal Components | | | | | Thickness | | Thickness | at % with respect to All Metal Components | | | | | Thickness |
| | | Zn | Ga | Ti | Sn | Y | (nm) | Composition | (nm) | Zn | Ga | Ti | Sn | Y | (nm) |
| | 50 | Balance | 14.0 | 2.0 | 2.0 | 1.0 | 10 | Ag-0.5 at % Sb-0.5 at % Ti | 100 | Balance | 14.0 | 2.0 | 2.0 | 1.0 | 10 |
| | 51 | Balance | 14.0 | 2.0 | 2.0 | 1.0 | 10 | Ag | 100 | Balance | 14.0 | 2.0 | 2.0 | 1.0 | 10 |
| | 52 | Balance | 14.0 | 2.0 | 2.0 | 1.0 | 5 | Ag-1.0 at % Cu | 50 | Balance | 14.0 | 2.0 | 2.0 | 1.0 | 5 |
| | 53 | Balance | 14.0 | 2.0 | 2.0 | 1.0 | 100 | Ag-1.0 at % Cu | 100 | Balance | 14.0 | 2.0 | 2.0 | 1.0 | 100 |

TABLE 3

| | | Ag Film | | Transparent Conductive Oxide Film | | | | | |
|---|---|---|---|---|---|---|---|---|---|
| | | | Thickness | at % with respect to All Metal Components | | | | | Thickness |
| | | Composition | (nm) | Zn | Ga | Ti | Sn | Y | (nm) |
| Example | 54 | Ag-1.0 at % Cu | 100 | Balance | 14.0 | 2.0 | 2.0 | 1.0 | 10 |
| | 55 | Ag-1.0 at % In | 100 | Balance | 14.0 | 2.0 | 2.0 | 1.0 | 10 |
| | 56 | Ag-1.0 at % Sn | 100 | Balance | 14.0 | 2.0 | 2.0 | 1.0 | 10 |
| | 57 | Ag-1.0 at % Sb | 100 | Balance | 14.0 | 2.0 | 2.0 | 1.0 | 10 |
| | 58 | Ag-1.0 at % Ti | 100 | Balance | 14.0 | 2.0 | 2.0 | 1.0 | 10 |
| | 59 | Ag-0.5 at % Cu-0.5 at % In | 100 | Balance | 14.0 | 2.0 | 2.0 | 1.0 | 10 |
| | 60 | Ag-0.5 at % Cu-0.5 at % Sn | 100 | Balance | 14.0 | 2.0 | 2.0 | 1.0 | 10 |
| | 61 | Ag-0.5 at % Cu-0.5 at % Sb | 100 | Balance | 14.0 | 2.0 | 2.0 | 1.0 | 10 |
| | 62 | Ag-0.5 at % Cu-0.5 at % Ti | 100 | Balance | 14.0 | 2.0 | 2.0 | 1.0 | 10 |
| | 63 | Ag-0.5 at % In-0.5 at % Sn | 100 | Balance | 14.0 | 2.0 | 2.0 | 1.0 | 10 |
| | 64 | Ag-0.5 at % In-0.5 at % Sb | 100 | Balance | 14.0 | 2.0 | 2.0 | 1.0 | 10 |
| | 65 | Ag-0.5 at % In-0.5 at % Ti | 100 | Balance | 14.0 | 2.0 | 2.0 | 1.0 | 10 |
| | 66 | Ag-0.5 at % Sn-0.5 at % Sb | 100 | Balance | 14.0 | 2.0 | 2.0 | 1.0 | 10 |
| | 67 | Ag-0.5 at % Sn-0.5 at % Ti | 100 | Balance | 14.0 | 2.0 | 2.0 | 1.0 | 10 |
| | 68 | Ag-0.5 at % Sb-0.5 at % Ti | 100 | Balance | 14.0 | 2.0 | 2.0 | 1.0 | 10 |
| | 69 | Ag | 100 | Balance | 14.0 | 2.0 | 2.0 | 1.0 | 10 |
| | 70 | Ag-1.0 at % Cu | 50 | Balance | 14.0 | 2.0 | 2.0 | 1.0 | 5 |
| | 71 | Ag-1.0 at % Cu | 100 | Balance | 14.0 | 2.0 | 2.0 | 1.0 | 100 |

TABLE 4

| | | Underlayer Oxide Film | | | | | | Ag Film | | Transparent Conductive Oxide Film | | | | | |
|---|---|---|---|---|---|---|---|---|---|---|---|---|---|---|---|
| | | at % with respect to All Metal Components | | | | | Thickness | | Thickness | at % with respect to All Metal Components | | | | | Thickness |
| | | Zn | Ga | Ti | Sn | Y | (nm) | Composition | (nm) | Zn | Ga | Ti | Sn | Y | (nm) |
| Example | 72 | Balance | 18.0 | 2.0 | 2.0 | 1.0 | 10 | Ag-1.0 at % Cu | 100 | Balance | 18.0 | 2.0 | 2.0 | 1.0 | 10 |
| | 73 | Balance | 18.0 | 2.0 | 2.0 | 1.0 | 10 | Ag-1.0 at % In | 100 | Balance | 18.0 | 2.0 | 2.0 | 1.0 | 10 |
| | 74 | Balance | 18.0 | 2.0 | 2.0 | 1.0 | 10 | Ag-1.0 at % Sn | 100 | Balance | 18.0 | 2.0 | 2.0 | 1.0 | 10 |
| | 75 | Balance | 18.0 | 2.0 | 2.0 | 1.0 | 10 | Ag-1.0 at % Sb | 100 | Balance | 18.0 | 2.0 | 2.0 | 1.0 | 10 |
| | 76 | Balance | 18.0 | 2.0 | 2.0 | 1.0 | 10 | Ag-1.0 at % Ti | 100 | Balance | 18.0 | 2.0 | 2.0 | 1.0 | 10 |
| | 77 | Balance | 18.0 | 2.5 | 0.0 | 0.0 | 10 | Ag-1.0 at % Cu | 100 | Balance | 18.0 | 2.5 | 0.0 | 0.0 | 10 |
| | 78 | Balance | 18.0 | 0.0 | 2.5 | 0.0 | 10 | Ag-1.0 at % Cu | 100 | Balance | 18.0 | 0.0 | 2.5 | 0.0 | 10 |
| | 79 | Balance | 18.0 | 0.0 | 0.0 | 2.5 | 10 | Ag-1.0 at % Cu | 100 | Balance | 18.0 | 0.0 | 0.0 | 2.5 | 10 |
| | 80 | Balance | 18.0 | 2.5 | 2.5 | 0.0 | 10 | Ag-1.0 at % Cu | 100 | Balance | 18.0 | 2.5 | 2.5 | 0.0 | 10 |
| | 81 | Balance | 18.0 | 0.0 | 2.5 | 2.5 | 10 | Ag-1.0 at % Cu | 100 | Balance | 18.0 | 0.0 | 2.5 | 2.5 | 10 |
| | 82 | Balance | 18.0 | 2.5 | 0.0 | 2.5 | 10 | Ag-1.0 at % Cu | 100 | Balance | 18.0 | 2.5 | 0.0 | 2.5 | 10 |
| | 83 | Balance | 20.0 | 2.0 | 2.0 | 1.0 | 10 | Ag-1.0 at % Cu | 100 | Balance | 20.0 | 2.0 | 2.0 | 1.0 | 10 |
| | 84 | Balance | 20.0 | 2.0 | 2.0 | 1.0 | 10 | Ag-1.0 at % In | 100 | Balance | 20.0 | 2.0 | 2.0 | 1.0 | 10 |
| | 85 | Balance | 20.0 | 2.0 | 2.0 | 1.0 | 10 | Ag-1.0 at % Sn | 100 | Balance | 20.0 | 2.0 | 2.0 | 1.0 | 10 |
| | 86 | Balance | 20.0 | 2.0 | 2.0 | 1.0 | 10 | Ag-1.0 at % Sb | 100 | Balance | 20.0 | 2.0 | 2.0 | 1.0 | 10 |
| | 87 | Balance | 20.0 | 2.0 | 2.0 | 1.0 | 10 | Ag-1.0 at % Ti | 100 | Balance | 20.0 | 2.0 | 2.0 | 1.0 | 10 |
| | 88 | Balance | 14.0 | 2.0 | 2.0 | 1.0 | 10 | Ag-1.0 at % Mg | 100 | Balance | 14.0 | 2.0 | 2.0 | 1.0 | 10 |
| | 89 | Balance | 14.0 | 2.0 | 2.0 | 1.0 | 10 | Ag-1.0 at % Zn | 100 | Balance | 14.0 | 2.0 | 2.0 | 1.0 | 10 |
| | 90 | Balance | 14.0 | 2.0 | 2.0 | 1.0 | 10 | Ag-1.0 at % Ge | 100 | Balance | 14.0 | 2.0 | 2.0 | 1.0 | 10 |
| | 91 | Balance | 14.0 | 2.0 | 2.0 | 1.0 | 10 | Ag-1.0 at % Al | 100 | Balance | 14.0 | 2.0 | 2.0 | 1.0 | 10 |
| | 92 | Balance | 14.0 | 2.0 | 2.0 | 1.0 | 10 | Ag-1.0 at % Ga | 100 | Balance | 14.0 | 2.0 | 2.0 | 1.0 | 10 |

TABLE 4-continued

| | | Underlayer Oxide Film | | | | | Ag Film | | Transparent Conductive Oxide Film | | | | | |
|---|---|---|---|---|---|---|---|---|---|---|---|---|---|---|
| | | at % with respect to All Metal Components | | | | | Thickness | | at % with respect to All Metal Components | | | | | Thickness |
| | | Zn | Ga | Ti | Sn | Y | (nm) | Composition | Thickness (nm) | Zn | Ga | Ti | Sn | Y | (nm) |
| | 93 | Balance | 14.0 | 2.0 | 2.0 | 1.0 | 10 | Ag-1.0 at % Pd | 100 | Balance | 14.0 | 2.0 | 2.0 | 1.0 | 10 |
| | 94 | Balance | 14.0 | 2.0 | 2.0 | 1.0 | 10 | Ag-1.0 at % Au | 100 | Balance | 14.0 | 2.0 | 2.0 | 1.0 | 10 |
| | 95 | Balance | 14.0 | 2.0 | 2.0 | 1.0 | 10 | Ag-1.0 at % Pt | 100 | Balance | 14.0 | 2.0 | 2.0 | 1.0 | 10 |
| | 96 | Balance | 14.0 | 2.0 | 2.0 | 1.0 | 10 | Ag-1.0 at % Bi | 100 | Balance | 14.0 | 2.0 | 2.0 | 1.0 | 10 |
| | 97 | Balance | 14.0 | 2.0 | 2.0 | 1.0 | 10 | Ag-1.0 at % Mn | 100 | Balance | 14.0 | 2.0 | 2.0 | 1.0 | 10 |
| | 98 | Balance | 14.0 | 2.0 | 2.0 | 1.0 | 10 | Ag-1.0 at % Sc | 100 | Balance | 14.0 | 2.0 | 2.0 | 1.0 | 10 |
| | 99 | Balance | 14.0 | 2.0 | 2.0 | 1.0 | 10 | Ag-1.0 at % Y | 100 | Balance | 14.0 | 2.0 | 2.0 | 1.0 | 10 |
| | 100 | Balance | 14.0 | 2.0 | 2.0 | 1.0 | 10 | Ag-1.0 at % Nd | 100 | Balance | 14.0 | 2.0 | 2.0 | 1.0 | 10 |
| | 101 | Balance | 14.0 | 2.0 | 2.0 | 1.0 | 10 | Ag-1.0 at % Sm | 100 | Balance | 14.0 | 2.0 | 2.0 | 1.0 | 10 |
| | 102 | Balance | 14.0 | 2.0 | 2.0 | 1.0 | 10 | Ag-1.0 at % Eu | 100 | Balance | 14.0 | 2.0 | 2.0 | 1.0 | 10 |
| | 103 | Balance | 14.0 | 2.0 | 2.0 | 1.0 | 10 | Ag-1.0 at % Gd | 100 | Balance | 14.0 | 2.0 | 2.0 | 1.0 | 10 |
| | 104 | Balance | 14.0 | 2.0 | 2.0 | 1.0 | 10 | Ag-1.0 at % Tb | 100 | Balance | 14.0 | 2.0 | 2.0 | 1.0 | 10 |
| | 105 | Balance | 14.0 | 2.0 | 2.0 | 1.0 | 10 | Ag-1.0 at % Er | 100 | Balance | 14.0 | 2.0 | 2.0 | 1.0 | 10 |

TABLE 5

| | | Underlayer Oxide Film Thickness: 10 nm Composition | Ag Film Thickness: 100 nm Composition | Transparent Conductive Oxide Film Thickness: 10 nm Composition |
|---|---|---|---|---|
| Comparative Example | 1 | ITO | Ag—1.0 at % Cu | ITO |
| | 2 | ITO | Ag—1.0 at % In | ITO |
| | 3 | ITO | Ag—1.0 at % Sn | ITO |
| | 4 | ITO | Ag—1.0 at % Sb | ITO |
| | 5 | ITO | Ag—1.0 at % Ti | ITO |
| | 6 | ITO | Ag—0.5 at % Cu—0.5 at % In | ITO |
| | 7 | ITO | Ag—0.5 at % Cu—0.5 at % Sn | ITO |
| | 8 | ITO | Ag—0.5 at % Cu—0.5 at % Sb | ITO |
| | 9 | ITO | Ag—0.5 at % Cu—0.5 at % Ti | ITO |
| | 10 | ITO | Ag—0.5 at % In—0.5 at % Sn | ITO |
| | 11 | ITO | Ag—0.5 at % In—0.5 at % Sb | ITO |
| | 12 | ITO | Ag—0.5 at % In—0.5 at % Ti | ITO |
| | 13 | ITO | Ag—0.5 at % Sn—0.5 at % Sb | ITO |
| | 14 | ITO | Ag—0.5 at % Sn—0.5 at % Ti | ITO |
| | 15 | ITO | Ag—0.5 at % Sb—0.5 at % Ti | ITO |
| | 16 | ITO | Ag | ITO |
| | 17 | None | Ag—1.0 at % Cu | ITO |
| | 18 | None | Ag—1.0 at % In | ITO |
| | 19 | None | Ag—1.0 at % Sn | ITO |
| | 20 | None | Ag—1.0 at % Sb | ITO |
| | 21 | None | Ag—1.0 at % Ti | ITO |
| | 22 | None | Ag | ITO |

TABLE 6

| | | Sheet Resistance (Ω/sq.) | Average Reflectance (%) | | Length of Over-Etching (μm) |
|---|---|---|---|---|---|
| | | | Blue Wavelength Range (400 to 500 nm) | Visible Range (400 to 800 nm) | |
| Example | 1 | 0.32 | 89.9 | 95.8 | 0.6 |
| | 2 | 0.34 | 89.7 | 95.6 | 0.4 |
| | 3 | 0.40 | 88.9 | 95.4 | 0.4 |
| | 4 | 0.34 | 89.8 | 95.7 | 0.6 |
| | 5 | 0.35 | 89.5 | 95.4 | 0.6 |
| | 6 | 0.42 | 88.9 | 95.2 | 0.5 |
| | 7 | 0.35 | 89.6 | 95.6 | 0.6 |
| | 8 | 0.37 | 89.4 | 95.4 | 0.5 |
| | 9 | 0.44 | 88.8 | 95.3 | 0.4 |
| | 10 | 0.31 | 90.1 | 96.2 | 0.8 |
| | 11 | 0.33 | 89.9 | 95.8 | 0.6 |
| | 12 | 0.39 | 89.0 | 95.6 | 0.6 |
| | 13 | 0.36 | 89.5 | 95.4 | 0.7 |

TABLE 6-continued

| | | Average Reflectance (%) | | |
|---|---|---|---|---|
| | Sheet Resistance (Ω/sq.) | Blue Wavelength Range (400 to 500 nm) | Visible Range (400 to 800 nm) | Length of Over-Etching (μm) |
|---|---|---|---|---|
| 14 | 0.39 | 89.2 | 95.3 | 0.5 |
| 15 | 0.46 | 88.7 | 95.1 | 0.4 |
| 16 | 0.35 | 89.8 | 95.6 | 0.5 |
| 17 | 0.37 | 89.6 | 95.3 | 0.4 |
| 18 | 0.37 | 89.5 | 95.4 | 0.6 |
| 19 | 0.34 | 90.0 | 95.7 | 0.7 |
| 20 | 0.40 | 89.3 | 95.2 | 0.6 |
| 21 | 0.41 | 89.7 | 95.7 | 0.8 |
| 22 | 0.42 | 89.6 | 95.5 | 0.7 |
| 23 | 0.43 | 89.6 | 95.4 | 0.7 |
| 24 | 0.39 | 89.9 | 95.9 | 0.8 |
| 25 | 0.45 | 89.4 | 95.3 | 0.9 |
| 26 | 0.34 | 90.0 | 95.6 | 0.5 |
| 27 | 0.36 | 89.7 | 95.5 | 0.6 |
| 28 | 0.37 | 89.6 | 95.5 | 0.6 |
| 29 | 0.33 | 90.1 | 95.8 | 0.6 |
| 30 | 0.40 | 89.4 | 95.4 | 0.5 |

TABLE 7

| | | | Average Reflectance (%) | | |
|---|---|---|---|---|---|
| | | Sheet Resistance (Ω/sq.) | Blue Wavelength Range (400 to 500 nm) | Visible Range (400 to 800 nm) | Length of Over-Etching (μm) |
|---|---|---|---|---|---|
| Example | 31 | 0.35 | 89.8 | 95.7 | 0.7 |
| | 32 | 0.37 | 89.6 | 95.4 | 0.6 |
| | 33 | 0.37 | 89.5 | 95.6 | 0.7 |
| | 34 | 0.34 | 90.0 | 96.0 | 0.6 |
| | 35 | 0.41 | 89.2 | 95.5 | 0.5 |
| | 36 | 0.34 | 89.7 | 95.6 | 0.5 |
| | 37 | 0.35 | 89.6 | 95.2 | 0.6 |
| | 38 | 0.36 | 89.4 | 95.3 | 0.6 |
| | 39 | 0.33 | 89.8 | 95.7 | 0.7 |
| | 40 | 0.41 | 89.1 | 95.1 | 0.4 |
| | 41 | 0.35 | 89.6 | 95.5 | 0.6 |
| | 42 | 0.36 | 89.5 | 95.4 | 0.7 |
| | 43 | 0.33 | 89.8 | 96.0 | 0.8 |
| | 44 | 0.37 | 89.4 | 95.4 | 0.6 |
| | 45 | 0.36 | 89.5 | 95.4 | 0.5 |
| | 46 | 0.35 | 89.7 | 95.8 | 0.6 |
| | 47 | 0.38 | 89.4 | 95.2 | 0.6 |
| | 48 | 0.36 | 89.6 | 95.7 | 0.5 |
| | 49 | 0.39 | 89.3 | 95.3 | 0.5 |
| | 50 | 0.37 | 89.5 | 95.6 | 0.6 |
| | 51 | 0.30 | 90.3 | 96.5 | 0.9 |
| | 52 | 0.82 | 86.2 | 95.0 | 0.9 |
| | 53 | 0.40 | 86.1 | 95.1 | 0.8 |

TABLE 8

| | | | Average Reflectance (%) | | |
|---|---|---|---|---|---|
| | | Sheet Resistance (Ω/sq.) | Blue Wavelength Range (400 to 500 nm) | Visible Range (400 to 800 nm) | Length of Over-Etching (μm) |
|---|---|---|---|---|---|
| Example | 54 | 0.35 | 89.8 | 95.6 | 0.3 |
| | 55 | 0.36 | 89.3 | 95.4 | 0.5 |
| | 56 | 0.39 | 89.3 | 95.3 | 0.5 |
| | 57 | 0.34 | 89.9 | 95.7 | 0.6 |
| | 58 | 0.40 | 89.2 | 95.2 | 0.4 |
| | 59 | 0.36 | 89.5 | 95.5 | 0.5 |
| | 60 | 0.38 | 89.4 | 95.4 | 0.6 |
| | 61 | 0.35 | 89.7 | 95.6 | 0.7 |
| | 62 | 0.38 | 89.4 | 95.4 | 0.6 |
| | 63 | 0.37 | 89.4 | 95.4 | 0.5 |

TABLE 8-continued

| | Sheet Resistance (Ω/sq.) | Average Reflectance (%) Blue Wavelength Range (400 to 500 nm) | Average Reflectance (%) Visible Range (400 to 800 nm) | Length of Over-Etching (μm) |
|---|---|---|---|---|
| 64 | 0.36 | 89.6 | 95.6 | 0.5 |
| 65 | 0.39 | 89.3 | 95.3 | 0.6 |
| 66 | 0.38 | 96.6 | 95.4 | 0.4 |
| 67 | 0.40 | 89.2 | 95.3 | 0.5 |
| 68 | 0.39 | 89.4 | 95.4 | 0.5 |
| 69 | 0.31 | 90.2 | 96.4 | 0.8 |
| 70 | 0.81 | 86.1 | 95.0 | 0.7 |
| 71 | 0.41 | 86.1 | 95.0 | 0.7 |

TABLE 9

| | | Sheet Resistance (Ω/sq.) | Average Reflectance (%) Blue Wavelength Range (400 to 500 nm) | Average Reflectance (%) Visible Range (400 to 800 nm) | Length of Over-Etching (μm) |
|---|---|---|---|---|---|
| Example | 72 | 0.39 | 89.4 | 95.4 | 0.5 |
| | 73 | 0.40 | 89.2 | 95.2 | 0.6 |
| | 74 | 0.41 | 89.1 | 95.2 | 0.6 |
| | 75 | 0.38 | 89.6 | 95.5 | 0.7 |
| | 76 | 0.44 | 88.9 | 95.2 | 0.6 |
| | 77 | 0.39 | 89.3 | 95.2 | 0.6 |
| | 78 | 0.39 | 89.5 | 95.3 | 0.6 |
| | 79 | 0.40 | 89.4 | 95.4 | 0.5 |
| | 80 | 0.40 | 89.3 | 95.4 | 0.5 |
| | 81 | 0.41 | 89.2 | 95.2 | 0.6 |
| | 82 | 0.40 | 89.3 | 95.3 | 0.5 |
| | 83 | 0.47 | 88.8 | 95.2 | 0.7 |
| | 84 | 0.48 | 88.5 | 95.1 | 0.8 |
| | 85 | 0.49 | 88.4 | 95.0 | 0.8 |
| | 86 | 0.45 | 88.9 | 95.3 | 0.9 |
| | 87 | 0.50 | 88.3 | 95.0 | 0.7 |
| | 88 | 0.36 | 89.5 | 95.4 | 0.4 |
| | 89 | 0.36 | 89.6 | 95.4 | 0.4 |
| | 90 | 0.38 | 89.4 | 95.3 | 0.6 |
| | 91 | 0.40 | 89.1 | 95.2 | 0.7 |
| | 92 | 0.38 | 89.3 | 95.3 | 0.5 |
| | 93 | 0.35 | 89.6 | 95.6 | 0.4 |
| | 94 | 0.34 | 89.8 | 95.7 | 0.3 |
| | 95 | 0.34 | 89.8 | 95.7 | 0.3 |
| | 96 | 0.33 | 89.9 | 95.8 | 0.6 |
| | 97 | 0.41 | 89.0 | 95.2 | 0.7 |
| | 98 | 0.43 | 88.8 | 95.2 | 0.7 |
| | 99 | 0.42 | 88.7 | 95.1 | 0.5 |
| | 100 | 0.45 | 88.5 | 95.1 | 0.7 |
| | 101 | 0.38 | 89.6 | 95.3 | 0.6 |
| | 102 | 0.37 | 89.5 | 95.3 | 0.6 |
| | 103 | 0.46 | 88.4 | 95.1 | 0.7 |
| | 104 | 0.47 | 88.2 | 95.0 | 0.8 |
| | 105 | 0.45 | 88.3 | 95.0 | 0.7 |

TABLE 10

| | | Sheet Resistance (Ω/sq.) | Average Reflectance (%) Blue Wavelength Range (400 to 500 nm) | Average Reflectance (%) Visible Range (400 to 800 nm) | Length of Over-Etching (μm) |
|---|---|---|---|---|---|
| Comparative Example | 1 | 0.32 | 85.2 | 94.2 | 3.1 |
| | 2 | 0.34 | 85.0 | 93.9 | 2.5 |
| | 3 | 0.35 | 84.8 | 93.8 | 2.8 |
| | 4 | 0.31 | 85.3 | 94.4 | 4.2 |
| | 5 | 0.38 | 84.6 | 93.6 | 3.1 |
| | 6 | 0.33 | 85.1 | 94.1 | 2.6 |
| | 7 | 0.34 | 85.0 | 94.0 | 2.8 |
| | 8 | 0.31 | 85.3 | 94.3 | 3.5 |

TABLE 10-continued

| | Sheet Resistance (Ω/sq.) | Average Reflectance (%) | | Length of Over-Etching (μm) |
|---|---|---|---|---|
| | | Blue Wavelength Range (400 to 500 nm) | Visible Range (400 to 800 nm) | |
| 9 | 0.38 | 84.9 | 94.8 | 3.2 |
| 10 | 0.36 | 84.9 | 93.9 | 3.0 |
| 11 | 0.33 | 85.2 | 94.1 | 3.6 |
| 12 | 0.40 | 84.8 | 93.7 | 2.8 |
| 13 | 0.34 | 85.0 | 94.1 | 3.3 |
| 14 | 0.38 | 84.7 | 94.1 | 2.7 |
| 15 | 0.36 | 84.9 | 93.9 | 3.7 |
| 16 | 0.29 | 85.6 | 94.8 | 5.6 |
| 17 | 0.33 | 85.1 | 94.0 | 2.9 |
| 18 | 0.35 | 85.0 | 93.8 | 2.3 |
| 19 | 0.36 | 84.7 | 93.6 | 2.6 |
| 20 | 0.32 | 85.2 | 94.2 | 4.0 |
| 21 | 0.39 | 84.5 | 93.5 | 2.9 |
| 22 | 0.30 | 85.5 | 93.7 | 5.4 |

As shown in Tables 6 to 10, in all the Examples, the average reflectance in a blue wavelength range was 86% or higher and the average reflectance in the visible range was 95% or higher, and the sheet resistance after film formation was 0.5 Ω/sq. or lower except for the samples (Examples 52 and 70) in which the thickness of the Ag film was 50 nm. Therefore, it was found that the multilayer film having high reflectance and sufficiently low resistance was obtained. In Examples 52 and 70, the thickness of the Ag film was thin at 50 nm. Therefore, the sheet resistance was about 0.8 Ω/sq., and the reflectance was slightly low. In addition, in Examples 53 and 71, the thickness of the transparent conductive oxide film formed on the Ag film was thick at 100 nm, and the absorptance increased. Therefore, the reflectance was slightly lower than that of the sample having a thickness of 10 nm.

On the other hand, in all the Comparative Examples, the average reflectance in the blue wavelength range were lower than 86% and the average reflectance in a visible range were lower than 95%, which were lower than those of Examples.

In addition, the results of the patterning test using the etching method are as follows. In Examples, as shown in FIG. 7 and Tables 6 to 9, the length of over-etching of the multilayer film was 1 μm or less, and thus it was found that an electrode pattern having no residues of the transparent conductive oxide film can be accurately formed.

On the other hand, in Comparative Examples, as shown in Table 10, the length of over-etching of the multilayer film was more than 1 μm, the residues of the transparent conductive oxide film were observed, and thus it was found that a multilayer reflection electrode pattern cannot be accurately formed by collective etching.

In addition, the results of the patterning test using the lift-off method are as follows. In Examples, it was found that an electrode pattern can be accurately formed.

In addition, the results of observing the surface of electrode pattern by visual inspection after the removal of the resist are as follows. In Examples, a change of the surface was not observed as compared to that before the test. On the other hand, in the multilayer films according to Comparative Examples in which the GZO film not including Sn, Y, and Ti was formed as the transparent conductive oxide film, film peeling was observed in places after the removal of the resist.

As described above, it was found that, according to Examples, it is possible to provide a multilayer reflection electrode film having a high reflectance in a visible range, in particular, in a blue wavelength range and having a low resistance value with which a fine electrode pattern can be easily formed using an etching method.

INDUSTRIAL APPLICABILITY

In the multilayer reflection electrode film according to the present disclosure, the reflectance in the visible range, in particular, in the blue wavelength range is high, and the resistance value is low. In addition, with the multilayer reflection electrode film, a fine electrode pattern can be easily formed using an etching method. Therefore, the multilayer reflection electrode film can be suitably used as, for example, an anode of an organic electroluminescence (EL) element.

REFERENCE SIGNS LIST

10: MULTILAYER REFLECTION ELECTRODE FILM
11: UNDERLAYER OXIDE FILM
12: Ag FILM
13: TRANSPARENT CONDUCTIVE OXIDE FILM
20: SUBSTRATE
30: MULTILAYER REFLECTION ELECTRODE PATTERN
41: RESIST FILM

The invention claimed is:

1. A multilayer reflection electrode film comprising:
a Ag film that is formed of Ag or an Ag alloy; and
a transparent conductive oxide film that is disposed on the Ag film,
wherein the transparent conductive oxide film is formed of an oxide that includes Zn and Ga and further includes one element or two or more elements selected from the group consisting of Sn, Y, and Ti, and
wherein the transparent conductive oxide film further includes Y.

2. The multilayer reflection electrode film according to claim 1,
wherein atomic proportions with respect to all the metal elements included in the transparent conductive oxide film are Ga: 0.5 at % to 30.0 at %, each of Sn, Y, and Ti: 0.1 at % to 10.0 at %, and a balance of Zn.

3. The multilayer reflection electrode film according to claim 2,
wherein atomic proportions with respect to all the metal elements included in the transparent conductive oxide film are Ga: 0.5 at % to 18.0 at %, each of Sn, Y, and Ti: 0.1 at % to 10.0 at %, and a balance of Zn.

4. The multilayer reflection electrode film according to claim 3,
wherein atomic proportions with respect to all the metal elements included in the transparent conductive oxide film are Ga: 0.5 at % to 14.0 at %, each of Sn, Y, and Ti: 0.1 at % to 10.0 at %, and a balance of Zn.

5. A multilayer reflection electrode pattern that is formed of the multilayer reflection electrode film according to claim 1, the multilayer reflection electrode pattern comprising a predetermined pattern.

6. A method of forming the multilayer reflection electrode pattern according to claim 5, the method comprising:
a multilayer reflection electrode film forming step of forming the multilayer reflection electrode film including the Ag film and the transparent conductive oxide film on a film forming surface of a base material;
a resist film forming step of forming a resist film having a predetermined pattern shape on the multilayer reflection electrode film;
an etching step of collectively etching the multilayer reflection electrode film on which the resist film is formed by using an acidic mixed solution including phosphoric acid and acetic acid as an etchant; and
a resist film removing step of removing the resist film after etching.

7. A method of forming the multilayer reflection electrode pattern according to claim 5, the method comprising:
a resist film forming step of forming a resist film having a reverse pattern shape of the predetermined pattern on a film forming surface of a base material;
a multilayer reflection electrode film forming step of forming the multilayer reflection electrode film including the Ag film and the transparent conductive oxide film on the film forming surface of the base material on which the resist film is formed; and
a resist film removing step of removing the resist film.

8. The multilayer reflection electrode film according to claim 1,
wherein the Ag film is formed of an Ag alloy including 0.2 at % to 2.0 at % of one element or two or more elements in total selected from the group consisting of Cu, In, Sn, Sb, Ti, Mg, Zn, Ge, Al, Ga, Pd, Au, Pt, Bi, Mn, Sc, Y, Nd, Sm, Eu, Gd, Tb, and Er and a balance of Ag and inevitable impurities.

9. The multilayer reflection electrode film according to claim 1,
wherein a thickness of the Ag film is 50 nm or more, and a thickness of the transparent conductive oxide film is 100 nm or less.

10. The multilayer reflection electrode film according to claim 1,
wherein an amount of Y is 2.5 at % or more in the transparent conductive oxide film.

11. A multilayer reflection electrode film comprising:
a Ag film that is formed of Ag or an Ag alloy;
a transparent conductive oxide film that is disposed on one side of the Ag film; and
an underlayer oxide film that is disposed on the other side of the Ag film,
wherein the underlayer oxide film and the transparent conductive oxide film are formed of an oxide that includes Zn and Ga and further includes one element or two or more elements selected from the group consisting of Sn, Y, and Ti, and
wherein the transparent conductive oxide film further includes Y.

12. The multilayer reflection electrode film according to claim 11,
wherein an amount of Y is 2.5 at % or more in the transparent conductive oxide film.

* * * * *